(12) United States Patent
Spackman et al.

(10) Patent No.: US 7,904,850 B2
(45) Date of Patent: Mar. 8, 2011

(54) SYSTEM AND METHOD FOR CONVERTING SOFTWARE TO A REGISTER TRANSFER (RTL) DESIGN

(75) Inventors: Chad Donald Spackman, Chester Springs, PA (US); Adrian George Port, Acton Park (AU); Lawrence Paul Lipke, Red Bank, NJ (US)

(73) Assignee: Cebatech, Eatontown, NJ (US)

( * ) Notice: Subject to any disclaimer, the term of this patent is extended or adjusted under 35 U.S.C. 154(b) by 108 days.

(21) Appl. No.: 11/948,551

(22) Filed: Nov. 30, 2007

(65) Prior Publication Data
US 2009/0144690 A1 Jun. 4, 2009

(51) Int. Cl.
*G06F 17/50* (2006.01)
(52) U.S. Cl. ............... 716/18; 716/2; 716/3; 716/17; 703/13; 703/14
(58) Field of Classification Search .......... 716/2–3, 716/17–18; 703/13–14
See application file for complete search history.

(56) References Cited

U.S. PATENT DOCUMENTS

| | | | |
|---|---|---|---|
| 6,226,776 B1 * | 5/2001 | Panchul et al. | 716/3 |
| 6,298,472 B1 | 10/2001 | Phillips | |
| 6,701,501 B2 * | 3/2004 | Waters et al. | 716/8 |
| 6,757,884 B2 | 6/2004 | Mandell et al. | |
| 6,792,580 B2 | 9/2004 | Kawakatsu | |
| 7,203,912 B2 * | 4/2007 | Moona et al. | 716/3 |
| 2004/0143801 A1 | 7/2004 | Waters et al. | |
| 2004/0153301 A1 | 8/2004 | Isaacs et al. | |
| 2004/0158788 A1 | 8/2004 | Kaszynski et al. | |
| 2004/0181385 A1 | 9/2004 | Milne et al. | |
| 2007/0157132 A1 * | 7/2007 | Cheng et al. | 716/3 |

OTHER PUBLICATIONS

Calazans et al.; From VHDL Register Transfer Level to Systemc Transaction Level Modeling: A Comparative Case Study; Proceedings of the 16th Symposium on Integrated Circuits and Systems Design; Sep. 2003; Computer Society; IEEE; pp. 355-360.

(Continued)

*Primary Examiner* — Nghia M Doan
(74) *Attorney, Agent, or Firm* — RatnerPrestia

(57) ABSTRACT

A method for converting a C-type programming language program to a hardware design, where the said program is an algorithmic representation of one or more processes. The C-type programming language program is compiled into a hardware description language (HDL) synthesizable design. The compiler categorizes variables as using either implicit memory or custom memory. Different accessor functions are used depending on which type of memory is used. The programming language may use ANSI C and the HDL may be Verilog Register Transfer Level (RTL). The hardware device generated from the HDL synthesizable design may be an Application-Specific Integrated Circuit (ASIC) or a Field Programmable Gate Array (FPGA).

15 Claims, 23 Drawing Sheets

OTHER PUBLICATIONS

Ghosh et al.; Design for Verification at the Register Transfer Level; Proceedings of the 15$^{th}$ International Conference on VLSI Design; 2002; Computer Society; IEEE; pp. 420-425.

Ge et al.; Compiling to FPGAS Via an Epic Compiler's Intermediate Representation; Proceedings of IEEE International Conference on Field Programmable Technology; Dec. 2003; pp. 431-434.

Douglas W. Jones; Register Transfer Logic, a Breakneck Review; http://www.cs.uiowa.edu/~jones/arch/notes/05rtl.html; Sep. 27, 2004; Part of the 22C:122/55:132 Lecture Notes for Spring 2004; pp. 1-19.

Smirnov et al., Automated Pipelining in ASIC Synthesis Methodology: Gate Transfer Level; Thirteenth International Workshop on Logic and Synthesis; Jun. 2004; pp. 416-423; California.

Berkeley Design Technology, Inc.; Migrating Designs From High-Level to Hardware Using Block-Diagram-Based DSP Tools; Reprinted from Proceedings of the 1995 International Conference on Signal Processing Applications and Technology; vol. 34; Issue 1; Oct. 1995, pp. 1-6.

* cited by examiner

```
#include "c2r/std.h"

c2r_foreign c2r_accessor ram512x32(int32_t *address,
                int4_t write_enable,
                int32_t write_data,
                int32_t c2r_out * read_data);

void static swap (int c2r_use (ram16x32) *a, int c2r_use(ram16x32) *b)
{
    int t;

t = *a;
    *a= *b;
    *b = t;
} void c2r_process main(void)
{
    int c2r_use (ram16x32) buf[16];

buf[0] = 1;
    buf[1] = 4;
    printf("This program swaps two integers\n");
    printf("Before swapping buf[0] = %d and buf[1] = %d\n", buf[0], buf[1]);
    swap (&buf[0], &buf[1]);
    printf("After swapping buf[0] = %d and buf[1] = %d\n", buf[0], buf[1]);
}
```

FIG. 9

```
1   // Embedded foreign interface function
2   void c2r_foreign c2r_interface c2r_rename(a_wd, "a/wd") ram32x32(uint1_t tran, uint32_t a_wd,
3           uint1_t we, uint4_t be, uint1_t rdy, uint1_t c2r_out * cmp, uint32_t c2r_out * rd);
4   // Custom memory accessor function for example memory on previous slide.
5   void c2r_accessor mem_accessor(uint32_t c2r_width(32) *address, uint1_t write_enable,
6           uint4_t enable, uint32_t write_data, uint32_t read_data)
7   {
8       uint1_t complete = 0;
9       uint32_t rdata;
10      // cycle 1 (address phase of memory transaction)
11      ram32x32(1, address, write_enable, 0, 0, &complete, &rdata);
12      c2r_wait();
13      // cycle 2 (begin data phase of memory transaction)
14      ram32x32(1, write_enable ? write_data : 0, write_enable, enable, 1, &complete, &rdata);
15      c2r_wait();
16      while (!complete) {
17          // cycles 3 - N (complete data phase of memory transaction)
18          ram32x32(1, write_enable ? write_data : 0, write_enable, enable, 1, &complete, &rdata);
19          c2r_wait();
20      }
21      // safestore read data
22      read_data = rdata;
23      // cycle N + 1 (finish memory transaction, return all signals to inactive levels)
24      ram32x32(0, 0, 0, 0, 0, &complete, &rdata);
25      c2r_wait();
26  }
```

FIG. 11

| | |
|---|---|
| 1 | // Input and output variables to serve as sinks and sources of I/O pin values. |
| 2 | static uint32_t rd_in; |
| 3 | static uint1_t cmp_in; |
| 4 | |
| 5 | static uint1_t tran_out = 0; |
| 6 | static uint32_t a_wd_out = 0; |
| 7 | static uint1_t we_out = 0; |
| 8 | static uint4_t be_out = 0; |
| 9 | static uint1_t rdy_out = 0; |
| 10 | |
| 11 | // External foreign interface function to shuttle data between I/O pins and static variables |
| 12 | void c2r_foreign c2r_interface |
| 13 | _c2r_attribute_(useclock(clk)) c2r_rename(a_wd, "a/wd") |
| 14 | ram32x32(uint32_t c2r_in rd, uint1_t c2r_in cmp, uint1_t c2r_out tran, |
| 15 | uint32_t c2r_out a_wd, uint4_t c2r_out be, uint1_t c2r_out rdy) |
| 16 | { |
| 17 | // Copy input signals to input variables & output variables to output signals. |
| 18 | rd_in = rd; cmp_in = cmp; |
| 19 | tran = tran_out; a_wd = a_wd_out; be = be_out; rdy = rdy_out; |
| 20 | } |
| 21 | |
| 22 | // Custom memory accessor to implement the timing model. |
| 23 | void c2r_accessor mem_accessor(uint32_t c2r_width(32) *address, uint4_t enable, |
| 24 | uint1_t write_enable, uint32_t write_data, uint32_t read_data) |
| 25 | { |
| 26 | // Cycle 1 (address phase of memory transaction) |
| 27 | tran_out = 1; a_wd_out = address; we_out = write_enable; |
| 28 | c2r_wait(); |
| 29 | // Cycle 2 (begin data phase of memory transaction) |
| 30 | a_wd_out = write_enable ? write_data : 0; be_out = enable; rdy_out = 1; |
| 31 | c2r_wait(); |
| 32 | // Cycle 3 - N (complete data phase of memory transaction) |
| 33 | while (!cmp_in) |
| 34 | c2r_wait(); |
| 35 | // Cycle N + 1 (wrap-up) |
| 36 | read_data = rd_in; tran_out = a_wd_out = be_out = rdy_out = 0; |
| 37 | c2r_wait(); |
| 38 | } |

FIG. 12

```
CALL POWER. C
#include "c2r/std.h"

extern int c2r_interface power(int, int);

void c2r_process main()
{
int x, y, z;

x = 2; y = 3;
z = power(x, y);
}
```

FIG. 13A

```
RET POWER. C
#include "c2r/std.h"

int c2r_interface power(int base, int exponent)
{
int i, power = base;

for (i = 1; i < exponent; ++i)
{
power = power*base;
}
return power;
}
```

FIG. 13B

```
callmath.c include "c2r/std.h"

void c2r_foreign c2r_interface
math(uint1_t c2r_in enable, uint2_t c2r_in opcode, int8_t c2r_in operand1,
     int8_t c2r_in operand2, int8_t c2r_out *result,
     uint1_t c2r_out *overflow, uint1_t c2r_out *complete);

enum opcodes {ADD, SUBTRACT, MULTIPLY, DIVIDE}; // add == 0, etc.

void c2r_process my_process()
  {
    int8_t operand1, operand2, result;
    uint1_t enable, overflow, complete;
    uint2_t opcode;

// Clear operation complete flag so we can see when it transitions to 1.
    complete = 0;

// Initialize inputs.
    operand1 = 5; operand2 = -13; enable = 1; opcode = MULTIPLY;

// Do the math. Hold inputs steady until operation is complete.
// Sample
math(enable, opcode, operand1, operand2, &result, &overflow, &complete);       while (! complete) {
     c2r_wait();    // wait a clock cycle
     math(enable, opcode, operand1, operand2, &result, &overflow, &complete);  // sample again
}
  if (result == 0)
     printf("The result is  %d\n", result);
  else
     printf("Result is too big for the return path. \n");

// Return inputs to quiescent state.
  enable = opcode = operand1 = operand2 = 0;
  math(enable opcode, operand1, operand2, &result, &overflow, &complete);
}
```

| | |
|---|---|
| 1 | // Example using external foreign IP that is an even-parity generator. Given 8-bits of input, |
| 2 | // it asynchronously returns an even-parity bit for the data. |
| 3 | static uint8_t data_out; // 8 bits of data to the parity generator |
| 4 | static uint1_t parity_in; // even parity bit from the parity generator |
| 5 | void c2r_foreign c2r_interface parity(uint1_t c2r_in parity, uint8_t c2r_out data) |
| 6 | { |
| 7 | data = data_out; |
| 8 | parity_in = parity; |
| 9 | } |
| 10 | void c2r_process set_parity() |
| 11 | { |
| 12 | uint9_t data[256]; |
| 13 | uint9_t i; |
| 14 | // Initialize array with all 8-bit values |
| 15 | for (i = 0; i < 256; ++i) |
| 16 | data[i] = i; |
| 17 | // Set parity (9th bit) for all the values using foreign even-parity generation. |
| 18 | for (i = 0; i < 256; ++i) |
| 19 | { |
| 20 | data_out = data[i]; |
| 21 | c2r_wait(); |
| 22 | data[i] |= parity_in << 8; |
| 23 | } |
| 24 | } |

SYSTEM AND METHOD FOR CONVERTING SOFTWARE TO A REGISTER TRANSFER (RTL) DESIGN

FIELD OF THE DISCLOSURE

This invention relates to hardware design. More specifically, this invention relates to hardware design using a software programming language.

BACKGROUND OF THE INVENTION

The design of hardware (e.g., an Application-Specific Integrated Circuit (ASICs), or a Field Programmable Gate Array (FPGAs) among others) is time consuming and expensive. Electronic Design Automation (EDA) tools strive to reduce verification time, design cycle time, and time to market of hardware. Design verification is a bottleneck in current design cycles because design size and complexity have increased. Using a conventional Register Transfer Level (RTL) design flow that relies on RTL simulation for verification may not be viable, because such an RTL simulation takes too long and is too costly.

SUMMARY OF THE INVENTION

The invention is embodied in a method and system for converting program code that is not in a hardware description language (HDL) to hardware. The program code includes an algorithmic representation of one or more processes using variables. The method includes the program code being complied into an HDL synthesizable design such that each of said variables in the program code is categorized as using either a respective implicit memory or a respective custom memory. When a respective variable in the program code is categorized as using the respective implicit memory, a first type of accessor function for accessing the respective implicit memory is defined. Further, when the respective variable is categorized as using the respective custom memory, a second type of accessor function for accessing the respective custom memory is defined. The second type of access function is different from that of the first type. The hardware is generated by implementing the first and second accessor functions, as hardware, based on the HDL synthesizable design.

BRIEF DESCRIPTION OF THE DRAWINGS

The invention is best understood from the following detailed description when read in connection with the accompanying drawings. It is emphasized that, according to common practice, various features/elements of the drawings may not be drawn to scale. Moreover in the drawings, common numerical references are used to represent like features/elements. Included in the drawing are the following figures:

FIG. 9 is exemplary program code to illustrate the declaration of a foreign accessor function to define an implicit memory in accordance with yet another exemplary embodiment of the invention;

FIG. 11 is exemplary program code illustrating a custom memory accessor function in accordance with yet another exemplary embodiment of the invention;

FIG. 12 is exemplary program code illustrating exemplary custom memory accessor function and exemplary external foreign interface function for the off-chip memory in accordance with yet another exemplary embodiment of the invention;

FIGS. 13A and 13B are exemplary program code illustrating various c2r directives in accordance with yet another exemplary embodiment of the invention;

FIG. 17 is program code illustrating an exemplary embedded foreign interface function in accordance with yet another exemplary embodiment of the invention;

FIG. 20 is exemplary program code illustrating an implementation of the even parity generator of FIG. 19 in accordance with yet another exemplary embodiment of the invention;

DETAILED DESCRIPTION OF THE INVENTION

Although the invention is illustrated and described herein with reference to specific embodiments, the invention is not intended to be limited to the details shown. Rather, various modifications may be made in the details within the scope and range of equivalents of the claims and without departing from the invention.

As used herein: Verilog® is a commonly used Hardware Description Language (HDL) which textually describes hardware at various levels of abstraction. The Register Transfer Level (RTL) is an intermediate level of abstraction that shows how data flows among registers and that may be used to synthesize a chip. Further, VHDL means VHSIC (Very-High-Speed Integrated Circuit) HDL, a design-entry language for FPGAs and ASICs in electronic design automation of digital circuits.

Conventional tools may be used to create hardware architecture source code by generating RTL to be verified in an RTL simulator. The verification in the RTL simulator is used because the source code in conventional hardware design does not represent the actual hardware implementation. Hardware architecture may be defined in such source code by coding the data path, resource access control and parallelism therein. By defining, for example, source code that includes attributes of hardware, the hardware design may be verified in the software (using a high-level programming language) environment with its associated performance benefits.

Figure 1:
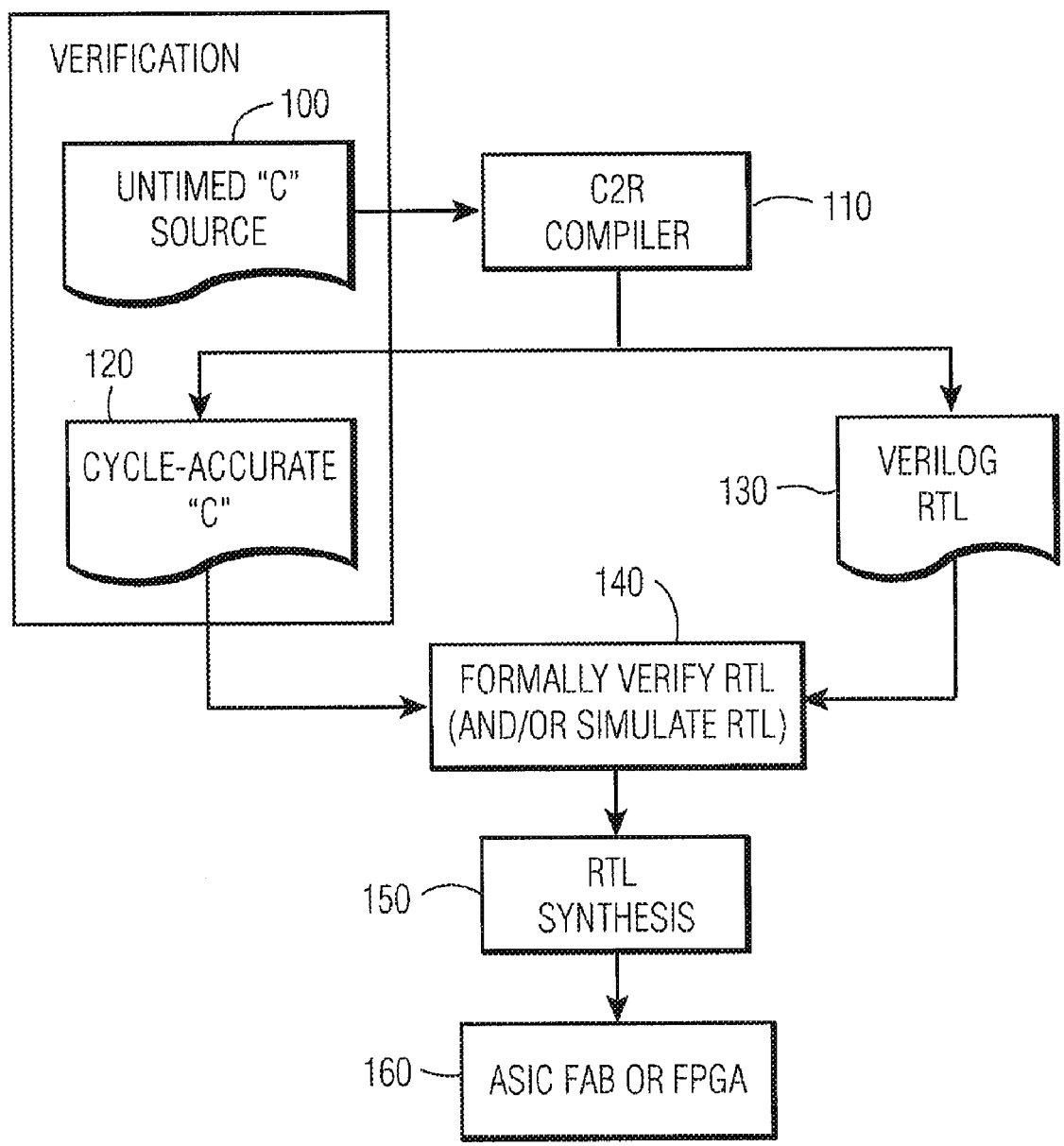
FIG. 1 is a block diagram illustrating a system in accordance with an exemplary embodiment of the invention.
Figure 2:
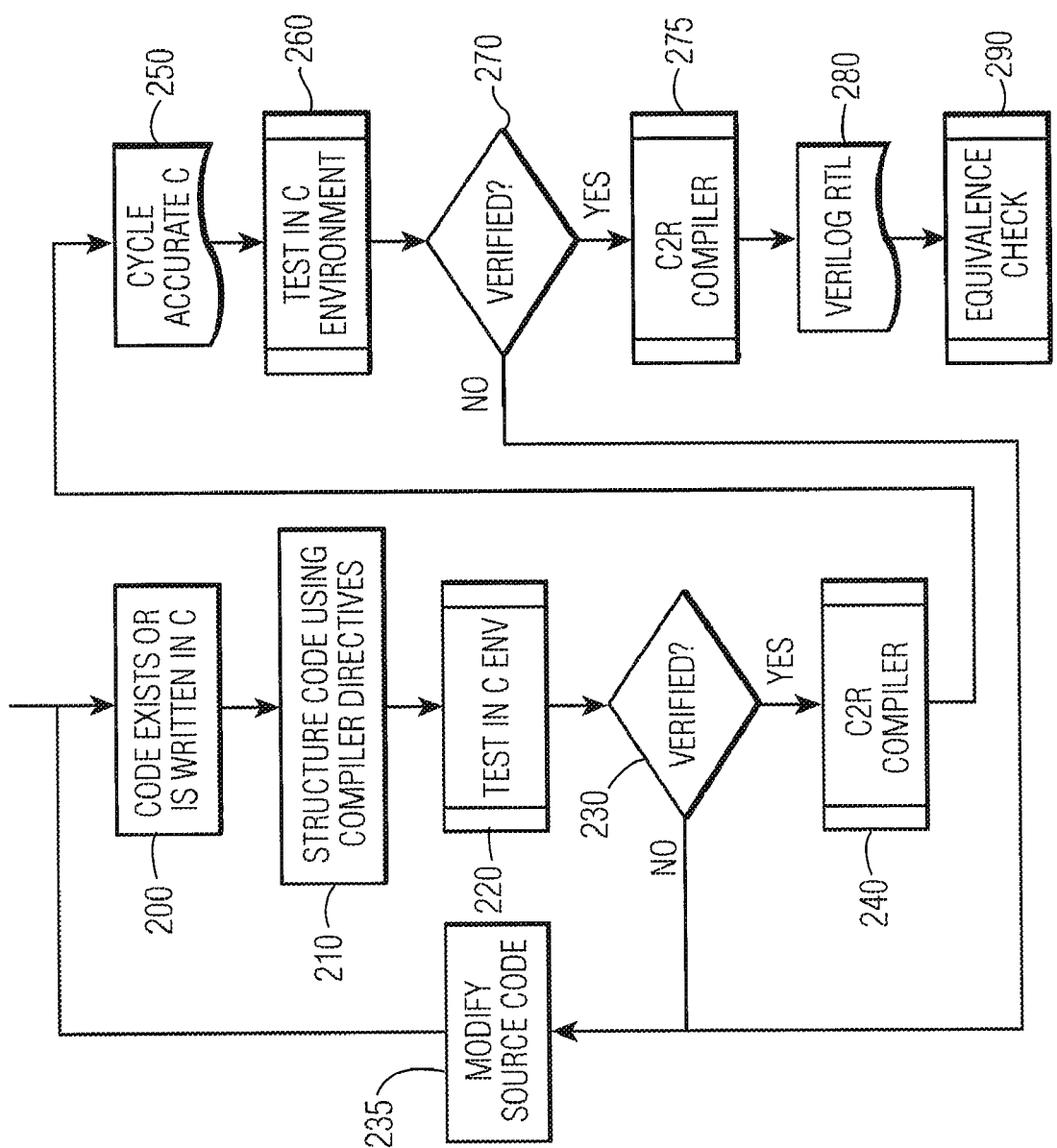
FIG. 2 is a flowchart illustrating a method of hardware/architecture design/fabrication which uses the system shown in FIG. 1.

FIG. 1 is a block diagram illustrating a system in accordance with an exemplary embodiment of the invention FIG. 2 is a flowchart illustrating a method of hardware/architecture design/fabrication which uses the system shown in FIG. 1.

The system of FIG. 1 is now described with content of the method shown in FIG. 2. At step 200, source code 100 of a programming language, for example, untimed ANSI C (hereafter sometimes referred to as "C") is compiled, tested and debugged in a pure software environment using a conventional compiler executing on a computer (not shown).

At step 210, the source code, for example, the untimed C source code may be restructured using compiler "attributes" to define features such as modules, module ports, and hardware parallelism (e.g., using processes/threads).

At step 220, a conventional compiler may be used to compile the restructured source code for testing and debugging in the pure software environment. After the structured source code is verified at step 230, it may be compiled by a C-to-RTL (C2R) compiler 110 at steps 240 and 275 and C2R compiler 110 may generate Cycle-Accurate source code (Cycle-accurate C—CAC) 120 at step 250 and may simultaneously generate synthesizable RTL 130 at step 280. Cycle-Accurate source code generally refers to source code having directives which control the executed code to run using a clocking schema (i.e., in a predetermined sequence, for example, such that certain results must be provided before other processes may be executed.)

If the restructured source code is not able to be verified at step 230, the source code may be modified (debugged) at step 235 and then the process may return to step 200.

At step 250, CAC 120 may be compiled with a standard compiler (e.g., a GNU Compiler Collection (GCC) compiler) and verified in the same native environment used for the original (not restructured) source code. Any issues resulting from the introduction of parallelism in the restructured source code may be debugged, at step 260. CAC 120 operates such that it executes in the same way, on a cycle-by-cycle basis, that the generated RTL executes in an HDL simulator. As such, the verification of the hardware design using an RTL simulation may be replaced with much faster C and CAC testing in a pure software environment. That is, the restructured C source code may be simultaneously compiled by C2R compiler 110 at steps 240 and 275 to generate CAC 120 at step 250 and synthesizable RTL 130 at step 280. In some exemplary embodiments steps 240 and 275 are combined into one step. CAC 120 may be verified in step 270 and CAC 120 may be used as a reference to which the generated RTL is compared. At step 290, a formal equivalence checker (EC) may be used to verify that the generated Verilog RTL 130 is functionally equivalent to CAC 120. Optionally, RTL co-simulation 140 may be used with or without the EC to verify the compiler-generated RTL.

If the restructured code is not able to be verified at step 270, the source code may be modified at step 235 and the process returns to step 200.

After the RTL is verified to be functionally equivalent to CAC 120, standard synthesis flow to hardware implementation may be used to fabricate hardware including conventional RTL synthesis 150 and Application-Specific Integrated Circuit (ASIC) fabrication or Field Programmable Gate Array (FPGA) fabrication 160.

Although standard ANSI C as the program language is shown, it is contemplated that other high-level languages (or combinations of languages) may be used that have a sufficient and useful degree of abstraction. Further, programs written in other languages may be translated into ANSI C using known techniques. Other program languages that may be used include APL, Ada, Algol, B, Basic, Kernighan & Ritchie C, C++, CLOS, COBOL, Clu, Common Lisp, Coral, Dylan, Eiffel, Emacs Lisp, Forth, Fortran, IDL, Icon, Java, Jovial, Lisp, LOGO, ML, Modula, Oberon, Objective C, PL/I, PL/M, Pascal, Postscript, Prolog, Python, RTL, Rexx, SETL, Simula, Sather, Scheme, Smalltalk, Standard ML, TCL, and TRAC, among others.

A standard C compiler may support pointers to structures, global variables, and function calls with arguments. A set of compiler attributes (described below) enable hardware parallelism, clocks, module ports and other RTL features to be generated by the standard C compiler. Using these compiler attributes for restructuring, the standard C compiler may compile known working C software to create hardware implementations of complex algorithms.

Figure 3:
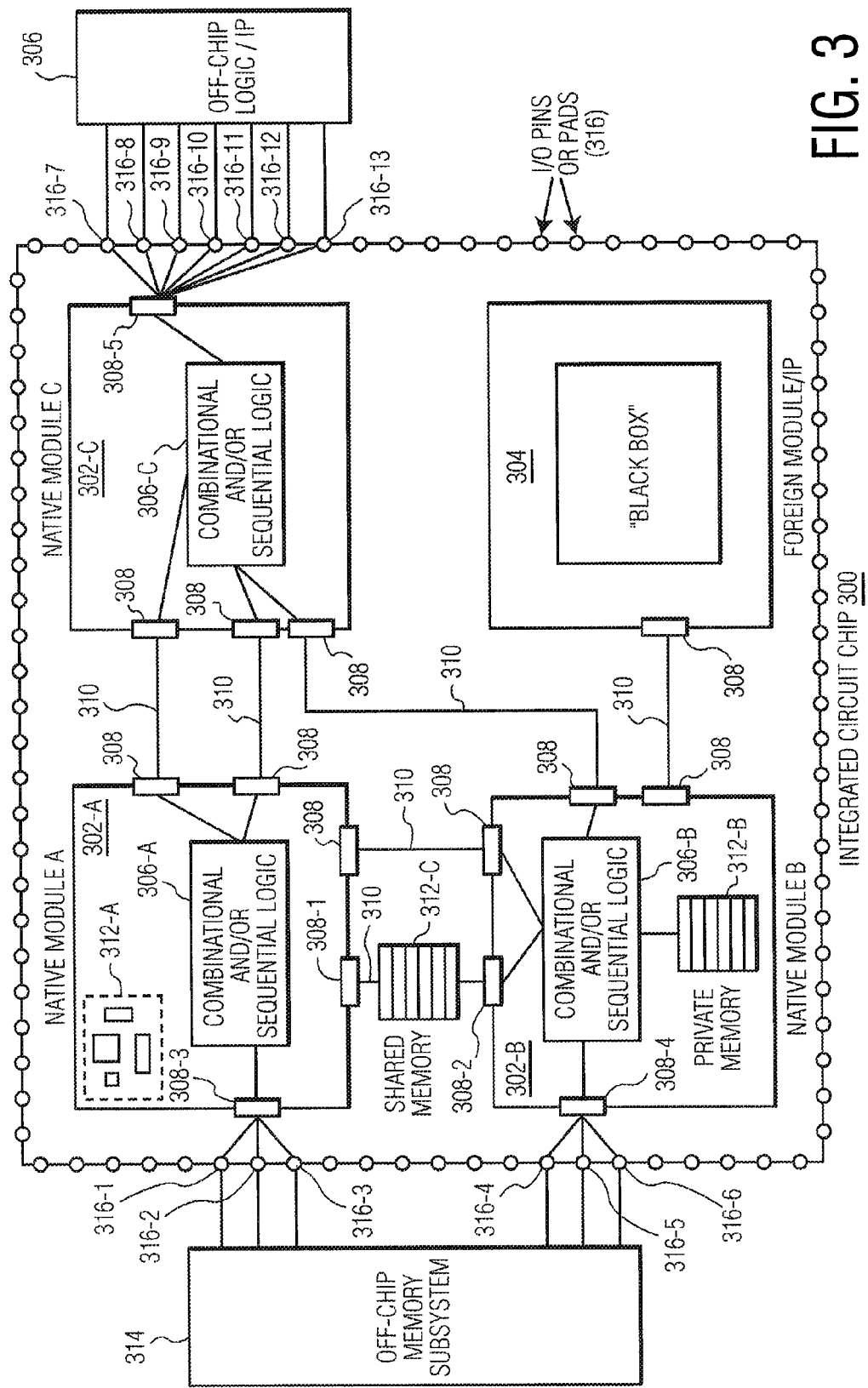
FIG. 3 is a block diagram illustrating components of an exemplary hardware system or a chip.

FIG. 3 is a block diagram illustrating components of an exemplary hardware system or a chip.

Hardware designs generally include modules (or components) which are configured to execute in parallel. A programming language, for example conventional C, however, has no inherent software equivalent of a module, so a module may be defined as an individual C compilation unit (e.g., a single C source file).

In hardware, modules have interfaces (ports) that are configured to connect one module to another. Interface functions may be defined to create the ports of C modules that map to the input and output ports of corresponding RTL modules. Interface functions define the module ports, and may also define certain operations on the data that is exchanged. When a C function is declared as an interface function, combinatorial and/or sequential Finite State Machine (FSM) logic may be generated by the conventional RTL synthesis 150 that implements this functionality. An interface function may also be declared as static. A static interface function may be local to the C module and may allow the synchronization and sharing of the created FSM to callers within the C module rather than through ports outside the C module.

In certain exemplary embodiments, three kinds of interface functions may exist: simple, shared and foreign. A simple interface function may be configured for communication (connection) between two modules; (e.g., for direct, point-to-point connection between the ports on one module and the ports on another module). A shared interface function may be configured for communication (connection) between more than two modules; (e.g., in a software environment there are two or more callers to the function, while in a hardware environment, arbitration logic may be generated to control which module has access to the (module) ports of the called function). For both simple and shared interface functions, direct, point-to-point connections between module ports, may be used (e.g., buses may not be used). A foreign interface may be used when the interface function accesses the ports on a block of third party intellectual property or external memory. Such a foreign interface function may define the input/output (I/O). An accessor function may be used to define the signaling/handshaking on the foreign interface for accesses to memory.

A "process" structure, using threads within a C module, may be used to model the parallel nature of hardware. That is, a process may be declared by labeling a C function with a C2R attribute, c2r_process. The C runtime system may guarantee deterministic results because only one process (thread) may be active at any point in time and each process may run until it suspends itself by calling the c2r_wait( ) function. A C function that is declared as a process generates a state machine in the RTL model. The c2r_wait function resolves to a clock boundary in the generated state machine. One or more processes may be declared within a C module. Any C source functions that are not declared as a process or interface function may be in-lined in the RTL code and may be part of the process which called that function.

As shown in FIG. 3, a chip 300 is typically designed from interconnected modules, each performing a defined function. Chip 300 includes one or more native modules 302-A, 302-B and 302-C, and may also include one or more foreign modules 304. The internal details of foreign modules are generally not known (black boxes). In addition to on-chip foreign modules 304, off-chip foreign modules 306 and 314 may also be used.

Although three native modules, one on-chip foreign module and two off-chip foreign modules are shown, it is contemplated that other types of modules and/or different numbers of such modules may be used.

Each module 302-A, 302-B and 302-C may be implemented with a mix of sequential (stateful) and combinational (stateless) logic 306-A, 306-B, 306-C, respectively.

Modules may interact with each other via well-defined I/O ports 308 connected by signal interfaces 310, e.g., by wires or other communication paths.

Modules may store state information and data in various types of on-chip and off-chip storage 312-A, 312-B and 314. The discrete flip-flop on-chip storage 312-A in module 302-A is arbitrarily accessible storage. All of its bits may be accessed simultaneously. Each bit does not have an address relative to the others. Because it is arbitrarily accessed, on chip storage 312-A does not have addressing, setup time and latency normally associated with other types of memories.

Memory generally refers to a type of storage that is addressable (i.e., each word in the memory has a position relative to the other words) and has latency (i.e., it takes at least one clock cycle to access a word). Implicit memory (such as the on-chip memory 312-B in module 302-B may be directly accessible to module 302-B. Memory may be implemented with dynamic Random Access Memory (DRAM), static RAM (SRAM), Register file memories (RFM) (e.g., an array of flip-flops with addressing to access a particular row/column in the array, among others or Read-Only Memory (ROM).

On-chip shared memory 312-C is similar to implicit memory and may be static or dynamic. It may, for example, have several ports 308-1 and 308-2, each of which may be connected to a different module 302-A and 302-B on chip 300.

Off-chip memory 314 may also be used. Such external memories 314 are separate chips that may be implemented, for example, with DRAM, SRAM, RFM or ROM. Off-Chip memories 314 may also be shared. They may have several ports, each connected to a different module 302-A and 302-B on chip 300.

Chip 300 may connect to external devices or other chips (e.g., off-chip memory 314 and off-chip logic 306) via various I/O pins (316-1, 316-2, 316-3 ... 316-13). Native module 302-A may connect to the off-chip memory 314 via port 308-3 and I/O pins 316-1, 316-2 and 316-3, native module 302-B may connect to the off-chip memory 314 via port 308-4 and I/O pins 316-4, 316-5 and 316-6 and native module 302-C may connect to off-chip logic 306 via port 308-5 and I/O pins 316-7 to 316-13.

Although intra-chip or inter-chip communication is shown using wires, it is contemplated that other types of connections are possible, for example, chips and/or modules may communicate wirelessly and may be magnetically and/or optically coupled.

C2R compiler 110 running on a computer may translate a hardware description coded in C into equivalent Verilog code. The Verilog code may be RTL code. C2R compiler 110 may translate each C file into a separate Verilog RTL module. C2R compiler 110 may convert an ANSI C program producing custom gate-level logic. After the RTL code is generated, back-end tools may be used to synthesize an actual chip.

The restructuring step at 210 provides directives that C2R compiler 110 may interpret to create the appropriate Verilog code. C2R compiler 110 may produce the following translations: (1) each C file may be converted into a Verilog module; (2) directives for Processes, Simple Interface Functions and Shared Interface Functions may be converted to sequential and/or combinational logic; (3) directives for Embedded Foreign Interface Functions may be converted to on-chip foreign modules; (4) directive for External Foreign Interface Functions may be converted to connections from native modules to off-chip modules; (4) formal parameters of each interface function may be converted to I/O ports on modules; (5) when a process in one module calls an interface function in another module, I/O ports may be created on the calling module; (6) directives for Foreign Accessor Functions and Custom Accessor Functions may be converted to pathways to corresponding memories; and (7) I/O ports of respective modules may be wired together to establish the signaling interfaces during the linker phase of the compilation. Each of these translations is described below.

Figure 4:
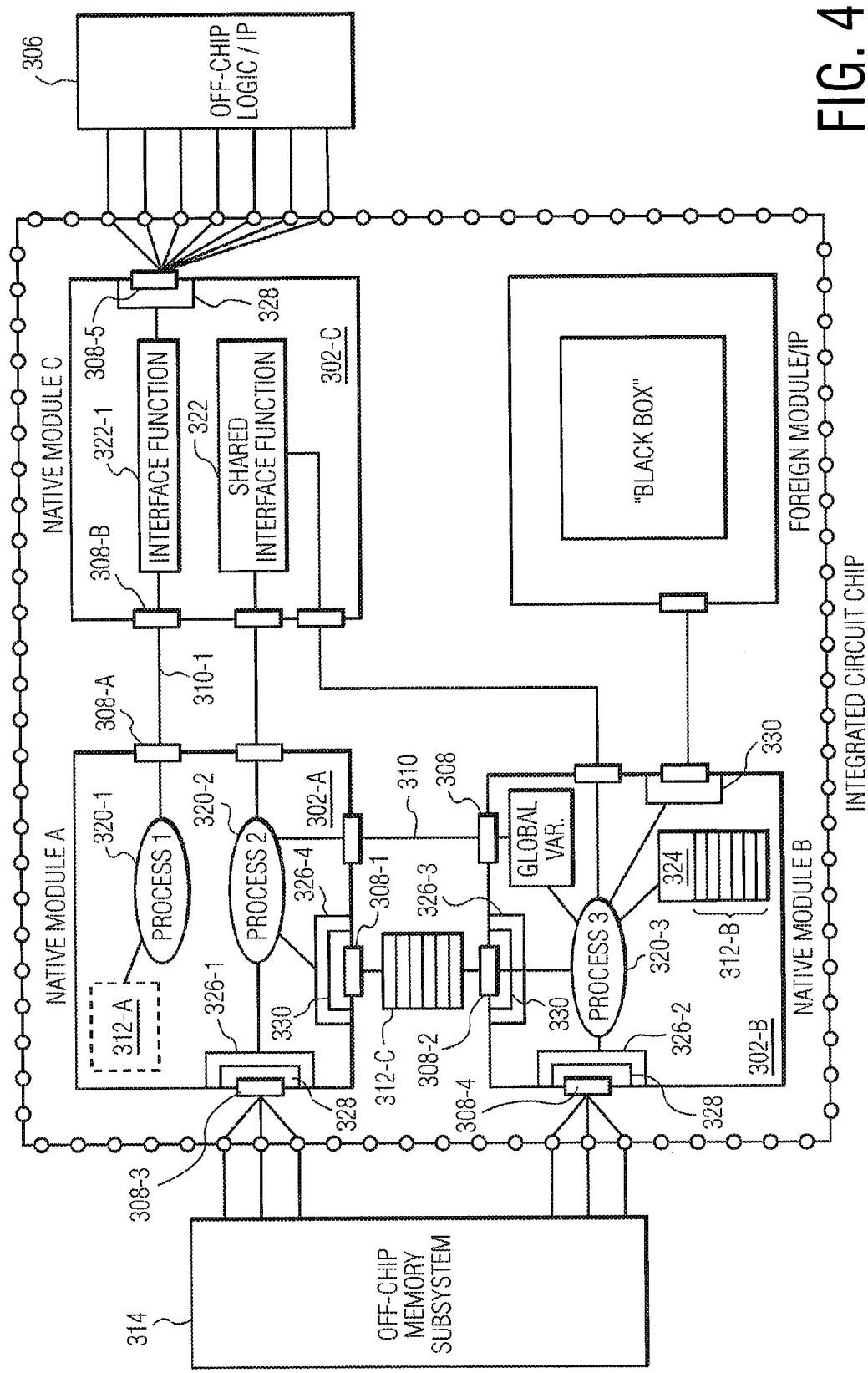
FIG. 4 is a schematic diagram illustrating overlays of program structures in accordance with yet another exemplary embodiment of the invention.

With reference to FIG. 4, processes 320-1, 320-2 and 320-3 and interface functions 322-1 and 322-2 are converted to combinational and/or sequential logic 306A and 306-B and 306-C. Memory (e.g., private memory) 312-B may have a foreign accessor function 324. Ports 308-1 to 308-4 connected to shared memory (on-chip memory 312-C and off-chip memory 314) may have custom accessor functions 326-1 to 326-4, respectively. Ports (e.g., 308-3 to 308-5) connected to off-chip modules 306 and 314 may have external foreign interface functions 328. Ports 308-1 and 308-2 connected to on-chip module 302-A and 302-B may have embedded foreign interface functions 330. Foreign and custom accessor functions and external and embedded foreign interface functions are also described below.

FIG. 4 is a schematic diagram illustrating overlays of program structures in accordance with yet another exemplary embodiment of the invention. The overlays of programming structures corresponds to the exemplary hardware system of FIG. 3.

As FIGS. 3 and 4 illustrate, processes that are translated by C2R complier 110 into digital logic. When C2R compiler 110 encounters an interface function, it creates the corresponding digital logic and it constructs ports on the module and internal connections in the module. The ports enable other modules to communicate with the module. Functions that are not converted into a process or an interface function may be inlined by C2R compiler 110.

Different types of accessor functions may be used by C2R compiler 110 to define different storage types. Standard flip-flop storage may not use an accessor function when it does not utilize addressing. An accessor function type, however, maybe established for addressable arrays of flip-flop storage such as RFMs. Other accessor function types may be used to override the default and inform C2R compiler 110 to create memory which is addressable. As shown in FIG. 4, a foreign accessor function type 324 may be used to declare implicit memory, and a custom accessor function type 326-1, 326-2, 326-3 and 326-4 may be used for on-chip and off-chip shared memory. On-chip shared memory generally refers to memory on the chip to be fabricated that is shared between or among on-chip modules. Off-chip shared memory generally refers to memory from a third party and that may be shared by two or more on-chip modules.

C2R compiler 110 may instantiate implicit and shared memory based on the type of accessor function used. For example, a specific memory such as ram512×32 may be specified in the restructured C code and C2R compiler 110 may instantiate it. As shown in FIG. 4, shared memory 314 may have ports 308-3 and 308-4 which may be described by third-party interface functions.

Embedded and external foreign interface functions may be used to inform C2R compiler 110 how to construct connections and ports. On-chip modules 302-A, 302-B, 302-C and 304, shown in FIG. 3, may be instantiated by C2R compiler 110 based on third party library routines. Off-chip modules 306 and 314 may be added in the fabrication process.

Because a single C source file may include the description of a single hardware module, C2R compiler 110 may convert the file into a single Verilog file or module. Other arrangements are also possible.

A complex hardware design may include numerous Autonomous FSMs (AFSMs). An AFSM normally waits for input, processes the input through a series of states, and produces an output. It repeats this input-process-output cycle continuously. When a hardware module is created by C2R compiler 110, processes may be converted to AFSMs.

Figure 5:
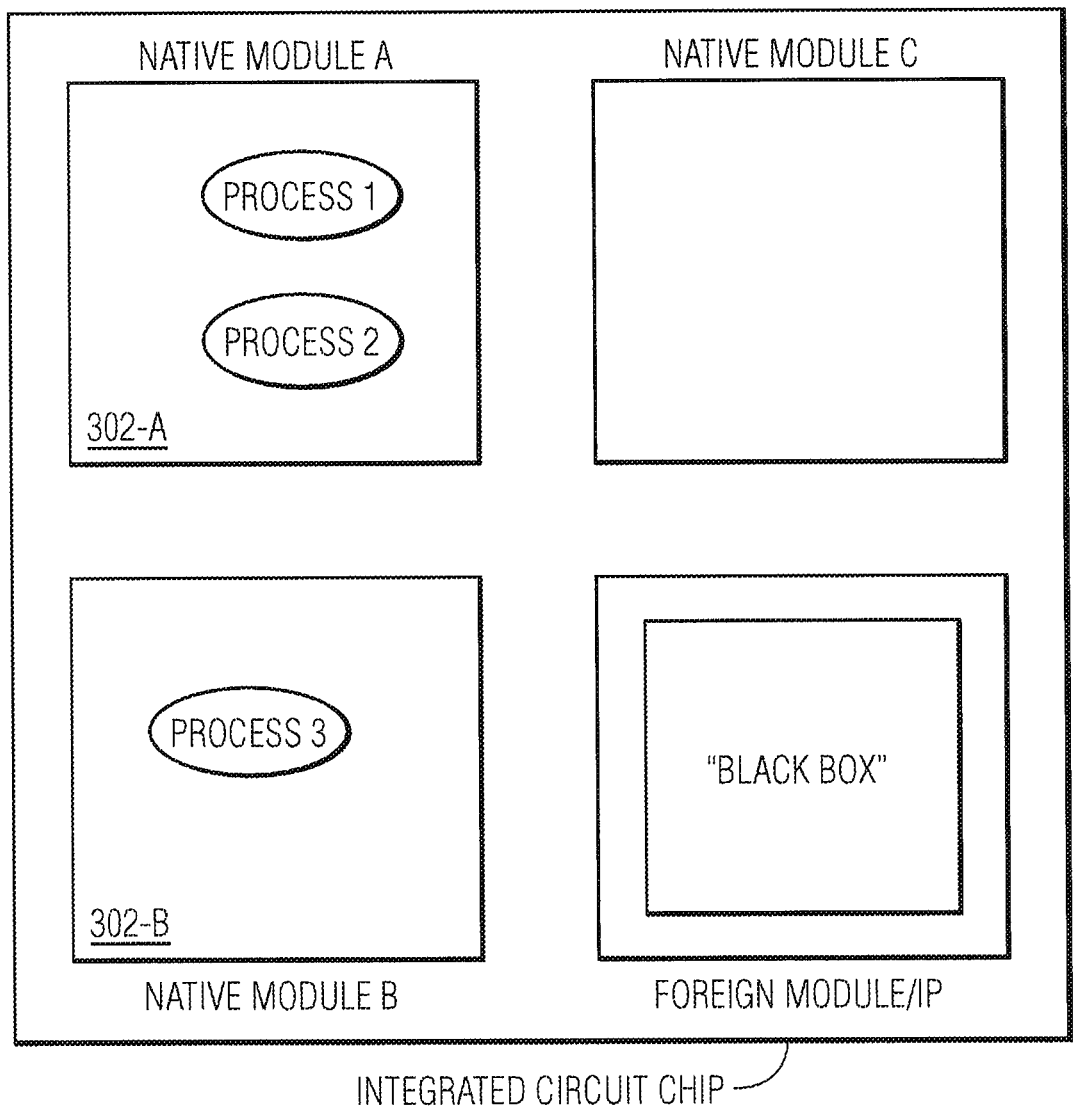
FIG. 5 is a block diagram illustrating exemplary processes relating to the overlays of FIG. 4.

FIG. 5 is a schematic diagram illustrating processes relating to the overlays of FIG. 4. As shown, module 302-A includes processes 1 and 2 and module 302-B includes process 3. Processes 1, 2 and 3 may be entirely inside module 302-A or 302-B.

A process in C code is a C function that may be annotated with the c2r_process directive and may be coded as an infinite loop (e.g., a while loop) to model the FSM's input-process-output cycle. The c2r_process attribute may instruct C2R compiler 110 to convert the C function into the FSM. A process function receives its inputs and delivers its outputs through a data passing mechanism such as input and output queues. Processes run concurrently in hardware. In the C environment this parallelism may be modeled by running each process function as an independent thread. That is, in certain exemplary embodiments, a process is one thread in a multi-thread software environment and an FSM in the corresponding hardware environment.

A hardware process typically waits by checking for input at each active clock edge. That is, the hardware process sleeps between active clock edges if no input is available. Correspondingly, a C software process checks for input in a loop. If no input is available, it sleeps by inserting a c2r_wait( ) directive in the loop. This relinquishes control so that other threads may run. Hence, c2r_wait( ) in the C software environment corresponds to waiting for the next active clock edge in the hardware environment. Further, in those exemplary embodiments where the C software environment uses multi-threading to model processes, only one C process may be active at a time (to ensure deterministic results). Other directives, such as C2R-fork and C2R-spawn described later, are provided for situations in which timing of results between threads may be controlled based on parallel processing of threads. That is, certain directives are possible which enable processing of thread concurrently when results of these threads are, for example, independent of each other.

Processes may run continuously, and may obtain their input values from one queue and pass their output values to another queue.

A directive c2r_process may be used to identify a process to C2R compiler 110. The c2r_wait( ) directive concludes processing for the current execution of a loop. In software, this directive causes the thread to relinquish control of the processor so that other threads may run. In hardware, the directive corresponds to waiting for the next active clock edge (i.e., the start of the next clock cycle). In the program code, the first entry in the while loop may be to check whether an input queue is empty. If so, the process waits for an amount of time and then checks again. The checking of the queue may be based on the scheduling of processes and when those processes may wait (i.e., hibernate) based on their c2r_wait( ) directives. In one exemplary process, when a character is present on the input queue, the process may remove it from the input queue and may calculate an encrypted character. The process may optionally place the encrypted character on an output queue. Declaring functions as processes may result in less hardware being generated but may cause timing problems due to buffering. In-line implementations may reduce these timing problems, but at the expense of extra hardware as multiple instances of the function may be created.

Modules, processes and interface functions provide the basic building blocks for defining hardware architecture in the restructured C source code. Chip area may be affected by either declaring C functions as processes/interface functions or in-lining them, for example.

Processes may perform some repeatable operation asynchronously relative to the rest of the system. They may have queuing on their front-end to provide elasticity (buffering) between operation requests and the actual operation execution. An interface function may be used to place operation requests in the queue. Functions/operations may also be performed in an interface function. The interface function may block other processing until the processing within the function completes. Thus, an interface function may provide a degree of synchronization. Such interface functions may be declared as static and/or shared, or they may be global.

The default action of C2R compiler 110 may be to inline an ordinary C function That is, each call to the function may be replaced with the function code.

As used herein, an ordinary C function is any function that is not specially annotated such as a process function or an interface function, among others.

Figure 6:
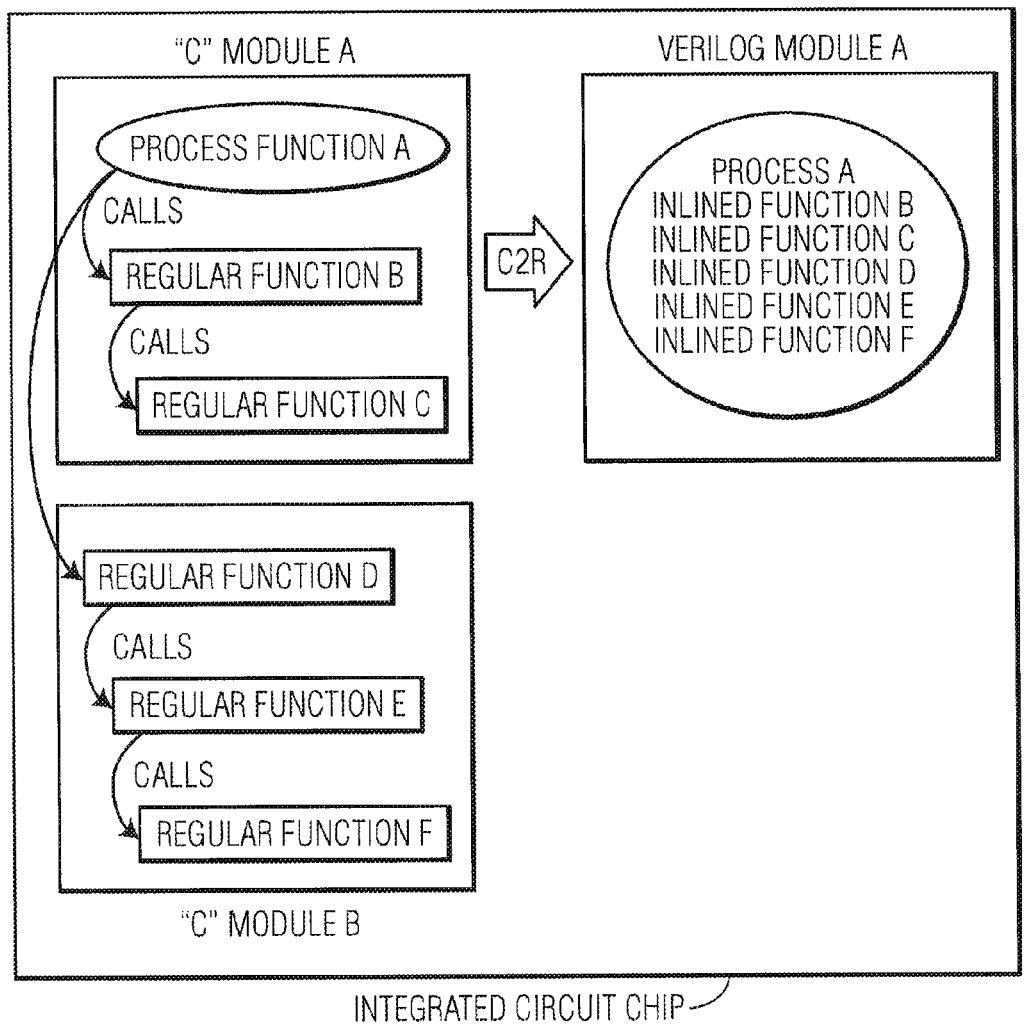
FIG. 6 is a block diagram illustrating processing of function calls related to the overlays of FIG. 4.

FIG. 6 is a schematic diagram illustrating processing of function calls related to the overlays of FIG. 4. In FIG. 6, C module A and C module B (e.g., software modules written in C code) are referred to as software modules A and B, respectively. As shown, software module A includes a process function A and two ordinary functions B and C and software module B includes ordinary functions D, E and F, each of which may be externally visible (i.e., not static). The C2R compiler 110 may produce Verilog module A that includes a process A which corresponds to the hardware implementation of the functions included in the software modules A and B.

Multiple levels of regular function calls may be inlined. The calling hierarchy in the software modules A and B may be flattened into a single process in the resulting Verilog module. For example, C2R compiler 110 may produce only Verilog Module A corresponding to software module A because software module B includes only ordinary functions that may be inlined into other modules.

In a pure software environment, memory is implicit. Software developers only choose between local versus global and statically versus dynamically allocated memory. In hardware, storage, in the form of registers and memories, including the method for accessing memories, are explicitly defined. C2R compiler 110 supports hardware storage including: (1) arbitrarily accessed flip-flop storage; (2) flip-flop based register files; (3) internally instantiated RAM; and (4) external memory.

C2R compiler 110 may include built-in accessor functions, for common on-chip synchronous RAMs, that define the signaling used to perform read and write operations for these types of memories. The accessor function may be declared with arguments that define, for example, width, depth, enables, and other characteristics of the RAM.

A memory module may have a fixed depth, i.e., a fixed number of words, (e.g., n words, numbered form 0 to n−1), and the address of a variable in a memory module is relative to the first item in the module. Multiple memories may occupy a common address space with each memory starting at its own base address. Because multiple memories may be used, different variables in different memories may have the same address.

C2R compiler 110 may recognize categories of memory including implicit memory and custom memory. Implicit memory adheres to pre-established timing models that C2R compiler 110 may incorporate. That is, C2R compiler 110 may have built-in knowledge of how to access such memory. Custom memory may be any memory that is not implicit memory. A developer may define the timing models of such customer memories.

C2R compiler 110 may use accessor functions to access either type of memory. It may use foreign accessor functions to access implicit memories and custom accessor functions to access custom memory.

C2R compiler 110 may assign any C variable, regardless of its size or type, to, for example, discrete flip-flop storage, as a default C2R compiler 110 may create wires (connections) from the flip-flop storage to the logic that use it.

Figure 7:
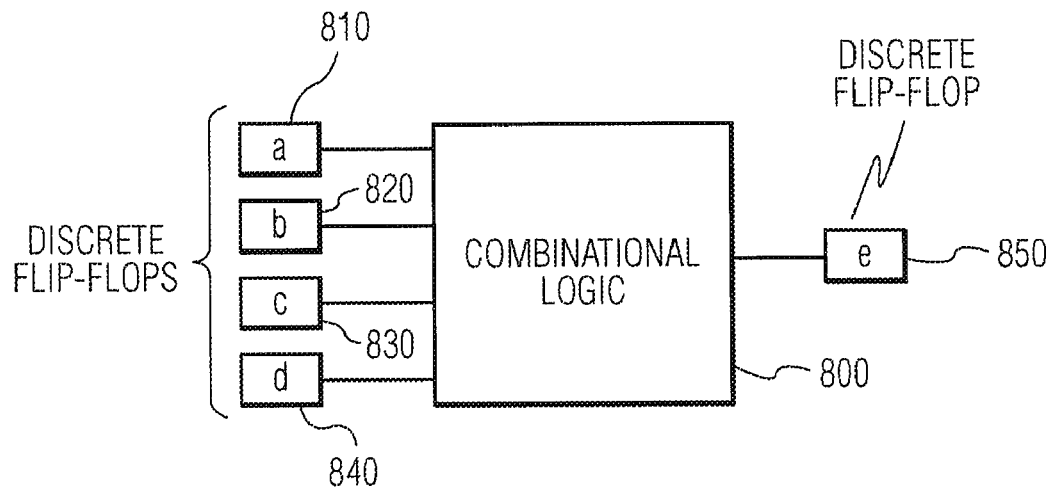
FIGS. 7 and 8 are block diagrams illustrating the difference between storing variables in exemplary flip-flop storage and in exemplary standard memory.
Figure 8:
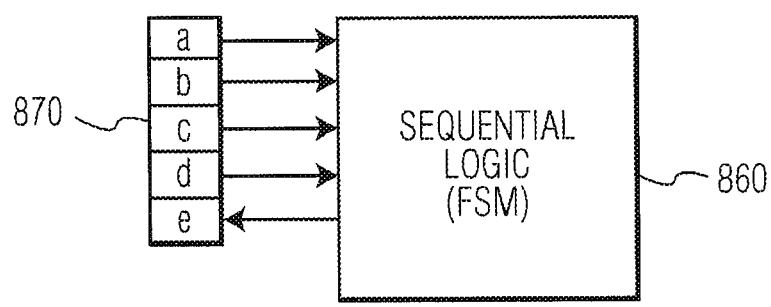

FIGS. 7 and 8 are block diagrams illustrating differences between storing variables in exemplary flip-flop storage and in exemplary standard memory.

In certain exemplary embodiments, C2R compiler 110 defines variables as discrete flip-flop storage. In such a situation, when variables a, b, c, d and e are declared and an operation using those variables is performed in the C environment, the resulting hardware is illustrated in FIG. 7. That is, each variable a, b, c and d may be stored as a discrete set of bits in flip-flop storage 810, 820, 830 and 840. The outputs of a, b, c and d may be wired directly to the inputs of combinational logic 800, and the output of combinational logic 800 may be wired directly to flip-flop storage 850. The input variables a, b, c and d may flow through combinational logic 800 that, for example, may multiply, add and/or shift, the results to produce the desired output in a single clock cycle.

In other exemplary embodiments, the variables may be stored in memory (using memory accessors as described below) and the hardware illustrated in FIG. 8 may be implemented. In this case, sequential logic 860 may be used to separately address each variable a, b, c, d and e for access to these variables via memory 870. The computation may be performed sequentially. As one example, the sequential logic 860 may sequentially fetch the value of a, b, c and d to perform operations on them, and then may store the final result in memory 870 at the memory address corresponding to the variable e. As each variable is typically accessed in a separate clock cycle, this may take many clock cycles.

On-chip memory may be any number of bits wide and any number of words deep. Off-chip, or external memory may be wide to compensate for latency. Reading and writing wider chunks of data may use fewer accesses and, thus, fewer clock cycles.

Referring back to FIGS. 3 and 4, foreign accessor function 324 is used with implicit memory 312-B. Foreign accessor function 324 may define the memory's signal interface (i.e., the names and widths of the signals), and it also may identity the timing model for the memory. C2R compiler 110 recognizes certain pre-established timing models, for example, an ASYNC timing model and the C2R_SYNC model, among others. The C2R_SYNC model is defined as follows.

(1) On a write operation, C2R compiler 110 presents address, data and control information before the active edge of the clock. After the edge, it returns control information to inactive levels unless another write operation is to be performed immediately such that a write operation takes one clock cycle.

(2) On a read operation, C2R compiler presents address and control information before the active edge of the clock. It reads data on the next active edge of the clock such that a single read takes two clock cycles, but back-to-back reads may be completed every cycle. Other timing models are also possible. The module that defines the implicit memory (also referred to as locally instantiated memory) may direct its access. For other modules to access the memory, the defining module may supply an interface function to provide such access.

Implicit memory may be a single-port memory such that only one process may access it at a given time, although dual and multi-port memories are also possible. A shared interface function may provide arbitration logic to serialize access by multiple processes.

An implicit memory may hold a single C variable, which may be a complex C variable, for example, an array or large structure. The C variable may be associated with an implicit memory using, for example the statement:
  variable-type c2r_use(foreign-accessor-name) variable-name;

The foreign accessor name matches the name of a cell that C2R compiler 110 instantiates to implement the implicit memory. Multiple variables may be associated with the same foreign accessor name, but C2R compiler 110 may associate each variable with its own instance of the memory cell. Thus, the statements:

```
variable-1-type c2r_use(foreign-accessor-name) variable-name-1;
variable-2-type c2r_use(foreign-accessor-name) variable-name-2;
``` may cause C2R compiler 110 to instantiate separate implicit memories from a cell whose name matches foreign-accessor-name.

Foreign accessor function prototypes may specify characteristics of the memory being accessed. Such features as the word size (the memory width), the number of words (the memory depth) and the smallest subset of a word that may be read or written in a single access are described in the foreign accessor prototype. C2R compiler 110 uses the information in a foreign accessor function prototype when it encounters a statement that accesses the memory (such as a=b) in a C program.

The code shown in Table 1 illustrates the components of a foreign accessor function.

TABLE 1

```
// Syntax of a foreign accessor function definition.
void c2r_foreign c2r_accessor
_c2r_attribute_(useclock(clock-name))
[ c2r_timing_model(C2R_SYNC) ]
[ c2r_rename (well-known-parameter-name, "actual-signal-name") . . . ]
accessor-function-name( well-known-parameters );
```

The prototype defines the signal interface to the memory, but not the timing of the signal interface. This contrasts with a custom memory accessor which has a body for defining memory timing as well as the signal interface.

The directives c2r_foreign and c2r_accessor indicate to C2R compiler 110 that the accessor function provides access to an implicit memory. The c2r_foreign directive specifies that the memory is instantiated from a third-party cell library.

C2R compiler 110 may generate hardware defining a single system-wide clock. The directive_c2r_attribute_(useclock(clock-name)) indicates to C2R compiler 110 the name of the memory's clock signal to be wired to the system clock.

The directive c2r_timing_model(C2R_SYNC) identifies the timing model adhered to by the implicit memory. The function's parameters may be chosen from a predetermined list. C2R compiler 110 may infer functionality of the memory from the names and types of the parameters, which correspond to the names of and widths of the signals to and from the memory. The parameter names include, for example: (1) address; (2) write_data; (3) read_data; (4) enable; (5) write_enable; and/or (6) read_enable.

In certain exemplary embodiments, C2R compiler 110 may include definitions of (1) parameters such as address, (2) read_data or write_data, and (3) read_enable or write_enable. For example, the parameters address, read_data and read_enable might be used for a read only memory (ROM).

In certain exemplary embodiments, the actual signal names that are used to access the memory are not the same as the above parameters. In such cases, the c2r_rename directive may be used to associate the parameter names with the actual names. C2R compiler 110 may then use the actual names in place of the above names when accessing the memory. That is, for example, the software code (C code) may not allow certain naming conventions for variables and the C2R rename directive may be used to rename such variables.

Once a foreign accessor function is specified, when a statement in the C code is encountered that reads or writes a variable in implicit memory, C2R compiler 110 may use the signal interface specified by the foreign accessor function to specify hardware that performs the read and write operations.

The address parameter specifies the size of a word and the size of an address. It may be used by C2R compiler 110 to specify the location in memory to read from or write into. The format of the address parameter specification may be:

type [c2r_width (N)]*address, where type matches the width of the memory, which is, the size of a word that may be read out, for instance, uint8_t, uint13_t or uint64_t (i.e., 8, 13 or 64 bits, respectively). C types like char or long may also be specified.

The width of the address (as opposed to the width of the memory) may be specified with an optional c2r_width(N) directive. The address width determines the depth of the memory, i.e., the number of words in memory. For instance, if the address width is 12 bits, the depth of the memory may be up to $2^{12}$, or 4096 words, and the words of the memory have the addresses 0x000 to 0xFFF. If c2r_width is not specified, the address width defaults to a predetermined width such as 16 bits or 32 bits.

The write_data parameter, if present, indicates that data may be written with the accessor. The read_data parameter, if present, indicates that data may be read with the accessor. These parameters may have a type attribute which is the same as the type specified for the address parameter. For example, suppose the address parameter is as follows:

uint32_t_c2r_width (8)*address

This defines a word as 32 bits, and an address as 8 bits long so that there are $2^8$=256 words of available memory. The write data parameter would be:

uint32_t write_data

The enable parameter, if specified, is a lane selector. A lane selector allows a subset of a memory word to be accessed. For example, if the word width of a memory is 32 bits, the memory may allow selection such that any combination of four bytes (8-bits) within a word may be selected for reading or writing. Each portion of a word that may be individually selected is called a lane. The format of the enable parameter declaration is:

uintX_t [c2r_active_low] enable

If the enable parameter is only one bit wide or if there is no enable parameter, then a single lane exists. If the enable parameter is N bits wide, then there are N lanes. The value of N used may evenly divide the word width of the memory. For example, if the memory has two 8-bit lanes, then the width of enable is two bits.

In certain exemplary embodiments, the enable parameter may be augmented with the c2r_active_low attribute to indicate that enable is an active low rather than an active high signal.

On any access to memory (read or write), C2R compiler 110 may set the enable bits to true (1) for lanes that it desires to access or to false (0) for lanes that it does not desire to access. For example, if a word is 32 bits wide, if four lanes exist and if a C program declared char a, and a's location is the second byte of a particular address, the statement a=7 is executed, C2R compiler 110 may set the enable parameter to 0100 and write 7 directly to the second byte in the word.

The read_enable and write_enable parameters may be used to indicate that a read or a write operation is taking place. It is common to have a read_enable/read_data and/or a write_enable/write_data combination. In such a case, the data may be read into read_data when the read_enable line is set and the data may be written from the write_data when the write_enable line is set. It is also possible to have only read_enable, read_data, and write_data parameters. In such a case, when write_enable is not defined, read_enable is a read/write selector. C2R compiler 110 may set read_enable to true (1) to read and to false (0) to write. Similarly, if read_enable is not defined, then write_enable may be the read/write selector.

The number of bits in the read_enable and write_enable parameters may be the same as or a different number relative to the enable parameter. For example, read_enable may be one bit and enable may be more than one bit. In this case, when read_enable is set, it means "read all selected lanes" as determined by the enable parameter. In the case of a read_enable with both read_data and write_data, if the read_enable is false, it means "write all selected lanes".

If enable is N bits wide, then read_enable may also be N bits wide. In this case, C2R compiler 110 may set the corresponding bits of both the enable and read_enable parameters to true to read a lane. Conversely, C2R compiler 110 may set the enable bit to true and the read_enable bit to false to write a lane. In certain exemplary embodiments, C2R compiler 110 does not perform simultaneous reading of some lanes and writing of other lanes. In other exemplary embodiments, simultaneous reading may be possible.

If a foreign accessor function defines both the read_enable and write_enable parameters, then C2R compiler 110 may set read_enable when it desires to read lanes and write_enable when it desires to write lanes. In this case, read_enable has only one active level. Active (true) means read, and inactive (false) means the signal has no effect. C2R compiler 110 may treat the write_enable in a manner similar to read_enable.

The directive c2r_use ( ) may be used to place a variable in implicit memory. The syntax is:

type c2r_use (FA) var;

where type is the type of the variable and FA is the name of the foreign accessor. If two c2r_use statements exists for the same implicit memory, C2R compiler 110 instantiates two memories, so that the following statements create two implicit memories and places var1 in the first memory and var2 in the second memory:

```
type1 c2r_use(FA) var1;
type2 c2r_use(FA) var2;
```

Table 2 illustrates the use of c2r_use ( ) with a memory.

TABLE 2

```
extern void c2r_foreign c2r_accessor USE_CLOCK RAM_TIMING
misc_accessor
   (uint32_t c2r_width (10) *address,
uint1_t write_enable,
uint32_t write_data,
   uint32_t *read_data);
```

In this example, USE_CLOCK is defined to be _c2r_attribute_(useclock(clock-name)) and RAM_TIMING is defined to be c2r_timing_model(C2R_SYNC). The address parameter indicates that a word is 32 bits wide and an address is 10 bits wide. A 10 bit address implies a depth of 1024 words. Because no enable parameter exists, the memory has one lane. No read_enable parameter exists so setting write_enable to 1 allows the write_data parameter to be written to the specified address, and setting it to 0 allows memory to be read from the specified address into the read_data parameter.

After declaring the above accessor, suppose the array myarr is placed in it with the following statement:

int c2r_use (misc_accessor) myarr[1024];

When C2R compiler 110 encounters the statement myarr[10]=myarr[9], it sets the address parameter to the address of myarr[9] and the write_enable parameter to 0, so that the value at the address may be read into read_data. It may then set the address parameter to the address of myarr[10], the write_data parameter to the read_data parameter, and the write_enable parameter to 1, so that the value in write_data may be written to the specified address.

C2R compiler 110 may instantiate an implicit memory in the hardware module that it generates when the following are true: (1) a properly declared a foreign accessor function exists for the memory; (2) a variable is associated with the memory via the c2r_use directive; and (3) the C program actually accesses the variable.

If the first item is true, C2R compiler 110 may successfully compile the module, but it may not instantiate a memory. If items one and two are true, C2R compiler 110 may successfully compile the module, but it may give a warning that an unused memory was declared whose name matches the name of the variable. If a foreign accessor function is declared with a read_data or write_data parameter, then the program actually reads or writes the variable, respectively. Otherwise, C2R compiler 110 may note (e.g., by an error message or a warning) that the memory it instantiates has an unconnected input, and that the generated hardware module may not operate properly.

In the hardware module that it generates, C2R compiler 110 may instantiate a module using the name and with an instance name that matches the name of the variable stored in the memory.

Exemplary program code for a foreign accessor function using 512 deep by 22-bit wide ROM is shown in Table 3.

TABLE 3

```
void c2r_foreign c2r_interface ___c2r_attribute___(useclock(clk))
c2r_timing_model(C2R_SYNC)
rom512x22(uint22_t c2r_width (9) *address, unit1_t read_enable,
uint22_t read_data);
```

This program code defines an accessor that may only be used for reading since only a read_data parameter is defined.

It is also possible to rename parameter names using the c2r_rename directive. This directive may be used, for example, if the memory's signal names do not match the parameter names.

Other exemplary program code for a foreign accessor function using 1K deep by 8-bit wide RAM is shown in Table 4.

TABLE 4

```
Void c2r_foreign c2r_accessor ___c2r_attribute___(useclock(clk))
c2r_timing_model(C2R_SYNC)
ram1Kx8(uint8_t c2r_width (10) *address, uint1_t write_enable,
uint8_t write_data, uint8_t read_data);
```

This example defines a read-write accessor. C2R compiler 110 sets write_enable to high to write data using the write_data parameter and to low to read data using the read_data parameter.

Although two different accessor functions are disclosed, it is contemplated that many other accessor functions are possible including different types of accessor functions corresponding to different types of memories SRAM and DRAM among others and different memory sizes/parameters. DRAM accessor functions, for example, may define a refresh operation.

The following steps may be used to generate a foreign accessor for implicit memory: (1) define the foreign accessor function (i) to define the memory's signal interface using a subset of predetermined parameters; and (ii) to identify its timing model; (2) use the c2r_use ( ) directive to place a non-pointer variable (e.g., an array) in the memory; and (3) use the non-pointer variable in a C program.

FIG. 9 is exemplary program code to illustrate the declaration of a foreign accessor function to define an implicit memory in accordance with yet another exemplary embodiment of the invention.

Implicit memory may be defined by declaring the foreign accessor function such as ram512×32 shown in FIG. 9. In c2r_process main, c2r_use directive may be used to place the array buf[16] in memory. Because the c2r_use( ) directive puts one variable into memory, an array is declared. Next, integers may be placed in the first two elements of the array. A swap function may be called with the addresses of these two elements to swap the two elements.

The c2r_use directives may inform C2R compiler 110 of the memory module. In this case, pointers may be passed, with the pointers being offsets from the beginning of the memory.

same predetermined parameter rules of the foreign accessor functions or may establish a new set of such rules.

Figure 10:
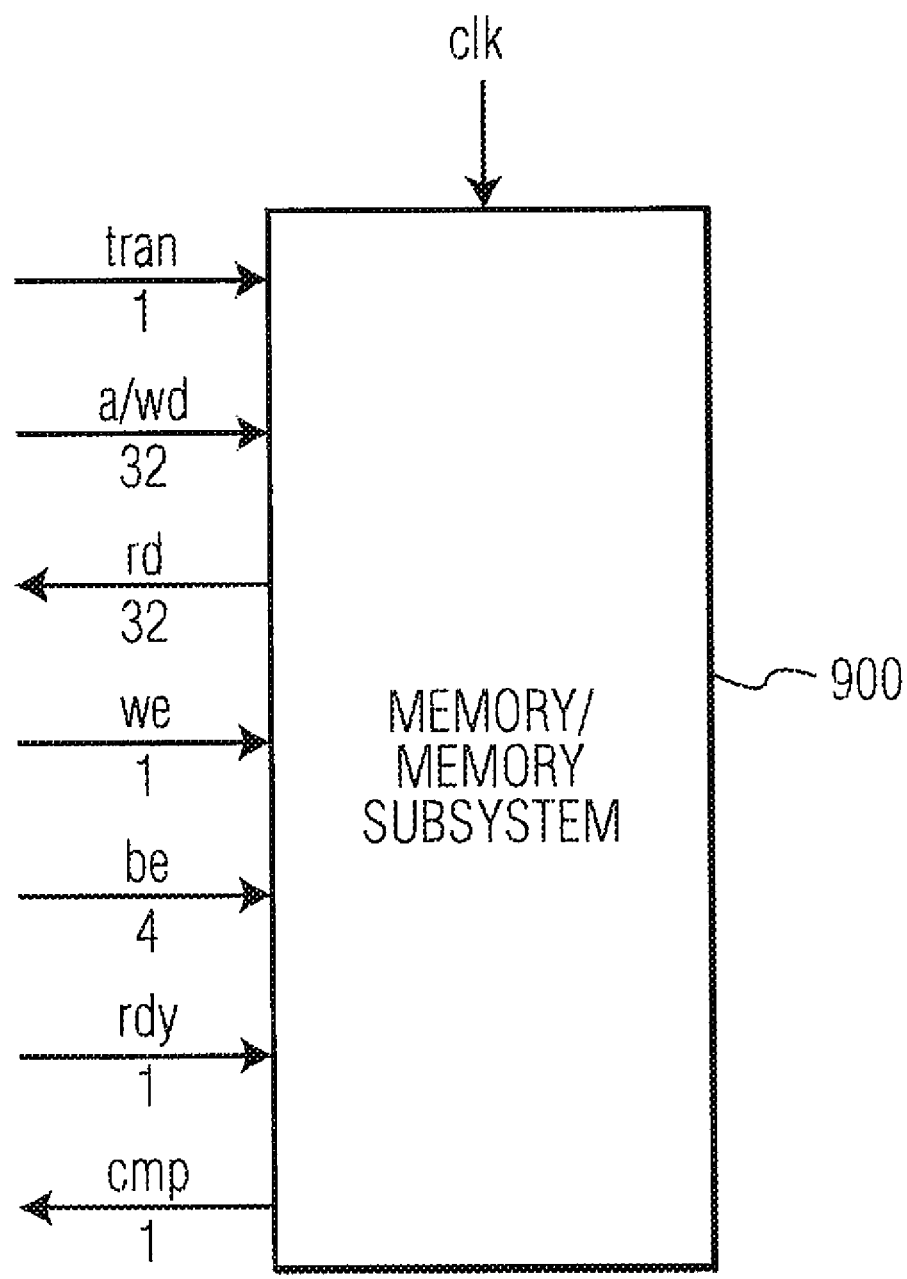
FIG. 10 is a block diagram illustrating an exemplary standard memory shown in FIG. 8.

FIG. 10 is a block diagram illustrating an exemplary standard memory shown in FIG. 8.

Now referring to FIG. 10, input and output signals tran, a/wd, rd, we, be, rdy and cmp for memory 900 are provided. The following Table 5 provides a signal summary for memory 900.

TABLE 5

Signal Summary

| | |
|---|---|
| tran | Transaction. High to start. Low when complete |
| a/wd | Address/write data bus. First address. Then write data. |
| rd | read data bus |
| we | write enable. High to write. Low to read. |
| be | Byte enables. High for bytes to be read or written. |
| rdy | Data ready. To be read or written by transaction initiator. |
| cmp | Complete. Memory has finished writing or reading data. |

Further, Table 6 provides the read and write transaction timing models for memory 900.

TABLE 6

| Cycle | Read Transaction Timing Model | Write Transaction Timing Model |
|---|---|---|
| 0 | Idle | Idle |
| 1 | tran = 1, a/wd = read address, we = 0 | tran = 1, a/wd = write address, we = 1 |
| 2 | tran = 1, a/wd = 0, we = 0, be = bytes to read, rdy = 1 | tran = 1, a/wd = write data, we = 1, be = bytes to write, rdy = 1 |
| 3 – N | Continue asserting Cycle 2 signals plus sample cmp and rd until cmp == 1 (meaning data is ready to be read) | Continue asserting Cycle 2 signals plus sample cmp until cmp == 1 (meaning the write has been completed) |
| N + 1 | Return all signals to inactive levels or 0. | Return all signals to inactive levels or 0. |

Any memory that does not adhere to C2R compiler's pre-established (well known) timing models is a custom memory that uses a custom accessor function. Custom accessor functions define how to access such a memory. Custom accessor functions 326-1, 326-2, 326-3 and 326-4 are shown in FIG. 4. Such functions may be used for both on-chip and off-chip custom memories 312C and 314. For such custom memories, both the signal interface and the timing model are defined using the custom accessor functions. The signal interface 308-1, 308-2, 308-3 and 308-4 are defined with the foreign interface function 328 and 330 and the timing model is defined with the custom accessor function 326-1, 326-2, 326-3 and 326-4.

The formal parameters of the foreign interface function define the names and widths of the signal interface. External foreign interface functions 328 define the signal interface to off-chip custom memory 314, while embedded foreign interface functions define the signal interface to on-chip custom memory 312C.

A custom accessor function 326-1, 326-2, 326-3 or 326-4 may be a C function coded to call foreign interface function 328 or 330 with correct argument values and in the correct sequence to implement a read from, or write to the corresponding memory 312C or 314. The accessor defines the memory access protocol and/or the timing model. The formal parameters of custom accessor functions may adhere to the In one exemplary embodiment, the first cycle may be an address phase of the memory transaction. To initiate the transaction, the tran signal may be asserted and kept asserted throughout the memory transaction. The address of a 32-bit word to be accessed may be placed on the a/wd bus. The we signal may be set to 0 or 1 to read or write, respectively. Further, the second cycle may begin the data transfer phase of the transaction. For a write, the write data may be put on the a/wd bus. Appropriate bits of be may be asserted to indicate which bytes of the 32-bit word are to be read or to be written. The signal rdy may be asserted to indicate either that data is available to be written on the a/wd bus or that it is ready to read data from the rd bus as soon as the data is available.

In cycles three through N, the model may wait for memory 900 to signal that it has completed the read or write operation by asserting cmp. For a read, as soon as cmp is asserted, read data may be read from the rd bus. For a write, as soon as cmp is asserted the write data is successfully written to memory 900.

In cycle N+1, the input signals are returned to inactive levels or 0.

FIG. 11 is exemplary program code illustrating a custom memory accessor function in accordance with yet another exemplary embodiment of the invention. The custom memory accessor function corresponds to the timing model of the memory 900 in FIG. 10.

In FIG. 11, the prototype of the foreign interface function is declared. Its parameters correspond to signal interface of memory 900. The attribute c2r_rename is used so that the a/wd parameter may be specified. The custom accessor function is defined. Its arguments are the arguments discussed above. It is implicitly called when the memory 900 is accessed. C2R compiler 110 calls the memory accessor, and specifies the address, data, etc. using the well-known (predetermined) parameters.

Further, the address parameter is declared to be type uint32_t indicating that the word width is 32 bits and the address width is 32 bits (as specified by c2r_width (32)) so that there are $2^{32}$ words in memory. The enable parameter is 4 bits wide to correspond to be input of the memory, and the write_data and read_data parameters are 32 bits corresponding to the word width of the memory.

The custom accessor calls the foreign interface function ram32×32( ) a first time to begin a transaction and a second time with the parameters set for the action, read or write repeatedly until the complete bit is set.

The data from rdata is copied to read_data in case the action is a read. The interface function is called a last time to clear the inputs.

To interface with an on-chip custom memory: (1) a prototype may be defined for the embedded foreign interface function with the parameters corresponding to the signals of the memory module; (2) the custom accessor may be defined with the subset of well-known parameters which calls the foreign interface function according to the timing requirements of the memory; (3) the c2r_map ( ) function may be used to place variables in the memory; and (4) these variables may be used in the normal way, except that a pointer in the custom memory may point to a variable in the memory.

Off-chip custom memory may be synchronous memory that uses multiple clock cycles to perform a single read or write. The timing model may be the same as that of on-chip memory or may be a different timing model.

FIG. 12 is exemplary program code illustrating exemplary custom memory accessor function 326-1 and 326-2 and exemplary external foreign interface function for the off-chip memory 314 in accordance with yet another exemplary embodiment of the invention.

Referring to FIG. 12, static variables may be defined to serve as sources and sinks of values for I/O pins to and from external memory 314. The static variable rd_in may receive its value from the memory's rd signal, and the memory's a/wd signal may receive its value from the static variable a_wd_out.

The external foreign interface function 328 is defined to shuttle data between the I/O pins 316-1 to 316-6 and the static variables. The function's body defines which I/O pins 316-1 to 316-6 to associate with certain static variables. For example, the memory signal rd, which is an output signal of the memory but an input signal (c2r_in) to the function, may be copied to the rd_in static variable. Further, the memory signal tran, which is an input signal to the memory but output signal (c2r_out) from the function, may receive its value from the tran_out static variable. Moreover, the memory's clk signal may be wired to the system clock, and the a_wd parameter to the actual signal name a/wd.

A custom memory accessor function may be defined to implement the timing model for reading from, and writing to memory 314. It may read from and write to memory 314 by reading from, and writing to the static variables. As with the on-chip memory, after the custom accessor is defined, the c2r_map ( ) function may be used to place variables in the memory and may include the following statements:

```
int c2r_map (ram32×256) a;
short c2r_map(ram32×256) b;
```

The variables a and b may be used as in any C program. A statement such as a=b, may invoke the custom accessor twice, to read the value of b from memory and then to write a value to memory for a.

The following steps may be used to create a custom accessor for off-chip memory: (1) static variables may be defined that correspond to the I/O pins of the external memory; (2) the foreign interface function may be defined as a series of assignment statements from the memory output pins to the corresponding static variables and from the static variables to the corresponding memory input pins; (3) the custom accessor may be defined with the subset of well-known parameters which implements the timing actions of the memory; (4) the c2r_map ( ) function may be used to place variables in the memory; and (5) these variables may be used in the normal way, except that a pointer in the custom memory points to a variable in this memory.

Interface functions define interfaces to interconnect modules (e.g., native modules to native modules, native modules to foreign modules, and native modules to other chips). Hardware modules interact using defined signal interfaces (e.g., I/O ports connected by wires). An output port on one module connects to an input port on another module.

Interface functions are generally created for functions in one C file that are accessed from other files to inform C2R compiler 110 how to construct connections among the modules. If a function is called from another file, C2R compiler 110 may determine how ports on this module and connections from the variables to the ports are created. When the calling module is compiled, ports and connections within it are created. When the modules are linked using C2R linker, connections are created between the ports on the two modules.

Static interface functions may also be created for functions that are only called from within the same file, and C2R compiler 110 may construct connections between the calling and called variables within the module.

Exemplary interface functions 322-1, 322-2, 328 and 330 are shown in FIG. 4. Simple interface functions 322-1 may expose the functionality of module 302-C to a single calling process 1 in another module 302-A. Shared interface functions 322 may expose functionality to multiple concurrent calling processes 2 and 3. Foreign interface functions 328 and 330 connect native modules 302-A and 302-B to on-chip (embedded) or off-chip (external) foreign modules/IP.

When a module defines an interface function, C2R compiler 110 may create I/O ports 308-1 to 308-5 on the defining module's boundary that correspond to the function's formal parameters and return value. For simple and shared interface functions, C2R compiler 110 may also generate logic corresponding to the function's body. The logic may be combinational and/or sequential logic to implement a function.

When a process in another module calls an interface function, I/O ports are created on the calling module's boundary. A C2R linker wires the ports on these modules together to complete the signal interface. Wiring is point-to-point between pairs of I/O ports. C2R compiler 110 may or may not generate signal interface buses. The bit-width of an I/O port is typically the same as the bit-width of the corresponding formal parameter or return value. For instance, if a C integer parameter is 32-bits wide, then the corresponding I/O port may also be 32 bits wide.

A simple interface function is a C function annotated with the compiler directive c2r_interface, which instructs C2R compiler 110 to wire the function to I/O ports on the module's boundary, and to create logic corresponding to the body of the function.

By default, the function's formal parameters may become input ports so that the calling process in the other module may pass values into the function over the signal interface, and the return value may become an output port so that the function may pass a value back to the calling process over the signal interface.

A call to an interface function is typically synchronous. That is, the calling process may be blocked until the interface function returns a signal. C2R compiler 110 may automatically create a call signal and a complete signal between the modules to establish synchronization. For asynchronous operations, processes may be used instead.

Functions that are not restructured into a process or declared to be an interface function may be inlined. That is, the code for the function may be inserted wherever it is called. An interface function may not be inlined, however, so that C2R compiler 110 produces a single hardware embodiment.

FIGS. 13A and 13B illustrates exemplary program code illustrating various C2R directives in accordance with yet another exemplary embodiment of the invention. The exemplary program code illustrates a restructured C code function power( ) that computes the power of a base raised to an exponent.

In the exemplary restructured code, a C2R header file may be included and several C2R attributes may be added. C2R compiler 110 may be informed of the external function, power, which is in another C file. C2R compiler 110 has information concerning the prototype of the external function so that the ports on the calling module may be constructed. Next, the c2r_process directive may be added to the definition of the function main to inform C2R compiler 110 that this is a process rather than an inline function or an interface function.

Figure 14:
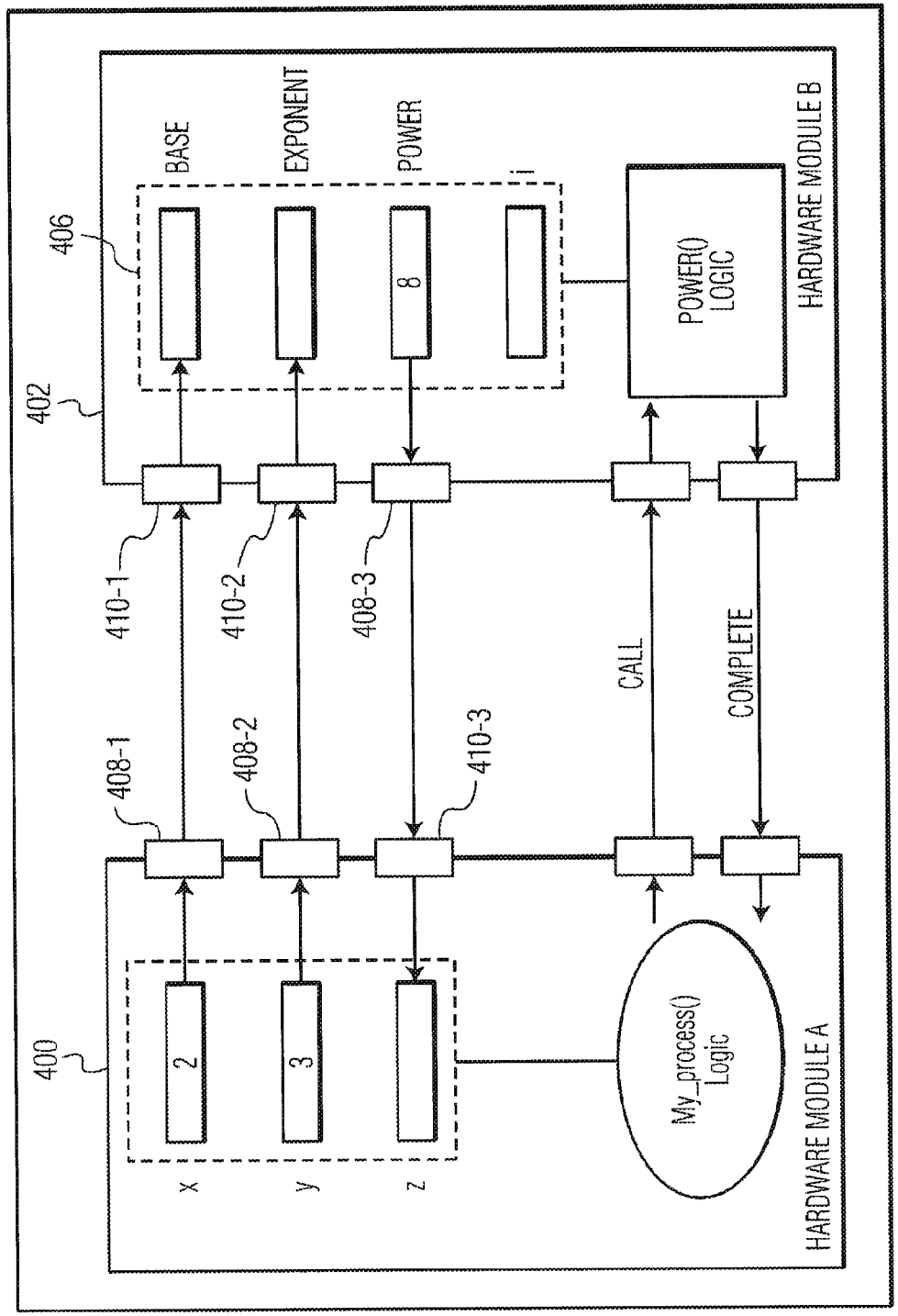
FIG. 14 is a block diagram illustrating hardware modules that are created using C2R compiler in accordance with yet another exemplary embodiment of the invention.

FIG. 14 is a block diagram illustrating hardware modules 400 and 402 that are created using C2R compiler 110 in accordance with yet another exemplary embodiment of the invention.

As shown, the variables x, y, z, base, exponent and power may be created in arbitrarily accessible flip-flop storage 404 and 406. As a result of the c2r_interface directive, C2R compiler 110 may create output ports 408-1 and 408-2 on module 400 and corresponding input ports 410-1 and 410-2 on module 402, so that the values of variables x and y in module 400 may flow across the signal interface into the variables base and exponent in module 402. Similarly, C2R compiler 110 may create an output port 408-3 on module 402 and a corresponding input port 410-3 on module 400 so that the computed answer may flow from module 402 back across the signal interface into variable z in module 400.

The values of variables x, y, z, base, exponent and power may be passed to the interface function. The C language also allows the parameters (variables) to be addresses, so that a function may modify the contents of the variable whose address is passed to it. When only values are passed, C2R compiler 110 may pass the values in the same way as in conventional C. There are situations in which additional information may also be passed by these interface functions. For example: (1) when variables are stored in addressable memory, addresses of variables may be passed and information about the addressable memory may also be passed; and (2) when variables are stored in flip-flop storage, the treatment of address parameters in conventional C code may be overridden.

FIG. 14 illustrates that unidirectional wiring may be implemented between modules 400 and 402. When the direction is from the called module 402 to the variable (e.g., z) in the calling module 400, the attribute c2r_out may be added to the variable z to indicate to C2R compiler 110 to wire a connection from the called function. Where the address is used to pass a value back, the c2r_out attribute may be used. This preserves the original C syntax where data is passed in one direction.

If data is passed into a function, the value may be passed and may use a c2r_in attribute. C2R compiler 110 may wire a connection to the called function. The c2r_in attribute may be used with a value or an address, but the value may be passed in either case. Table 7, for example, provides a summary of the use of such attributes:

TABLE 7

Memory and use of c2r_in and c2r_out

| Attribute | Example of Prototype | Example of Call | Direction of Connection |
|---|---|---|---|
| c2r_in | foo(c2r_in a) | foo(a) | calling to called: value |
|  | foo(c2r_in * a) | foo(&a) | is passed to callee |
| c2r_out | bar(c2r_out * b) | bar(&b) | called to calling: value |
|  | bar(c2r_out b) NA | bar(&b) NA | is passed to caller |

The c2r_in and c2r_out attributes may cause C2R compiler 110 to perform actions regardless of the type of memory used. That is, c2r_in and c2r_out attributes may be used with different types of memories to pass values.

Figure 15:
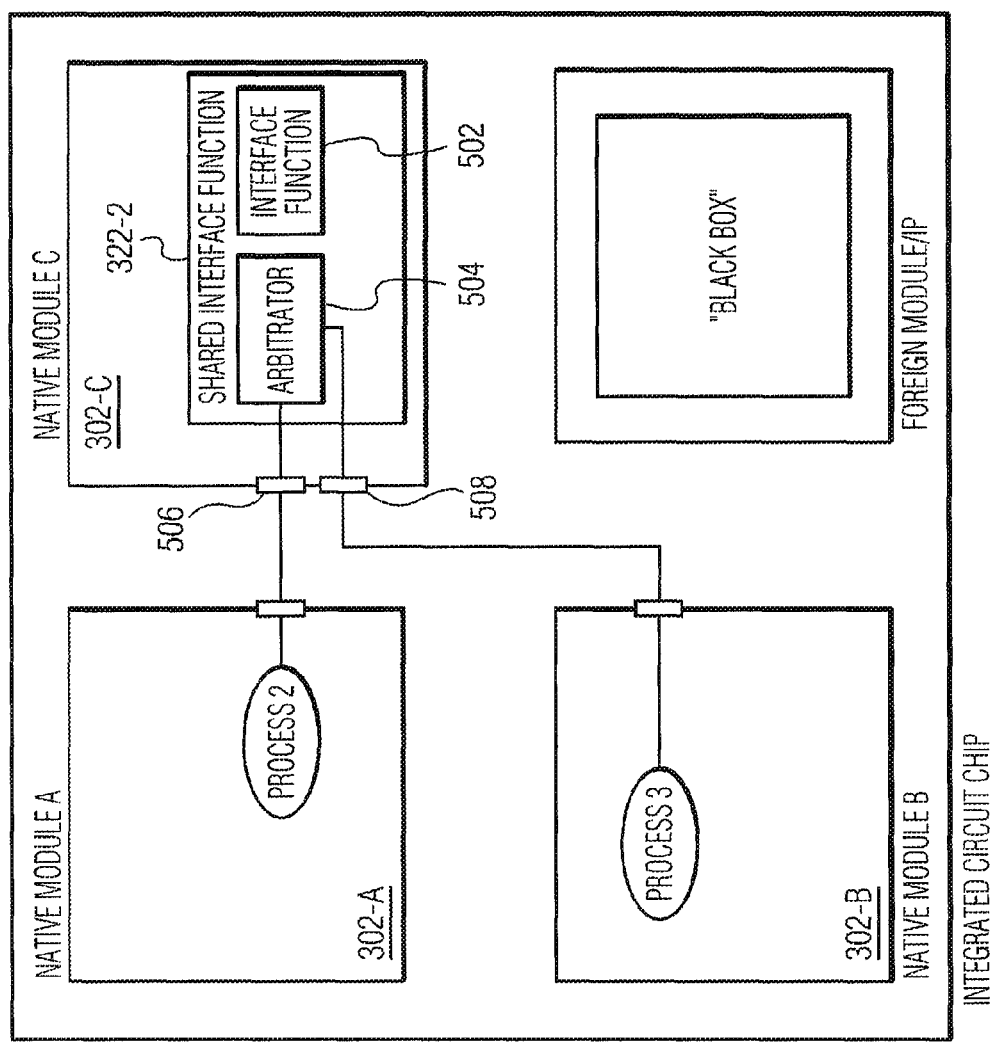
FIG. 15 is a schematic diagram illustrating an exemplary shared interface function in accordance with yet another exemplary embodiment of the invention.

FIG. 15 is a schematic diagram illustrating an exemplary shared interface function in accordance with yet another exemplary embodiment of the invention. The exemplary shared interface function corresponds to the shared interface function of FIG. 4.

Referring to FIG. 15, a shared interface function 322-2 may expose the functionality of module 302-C to multiple processes 2 and 3 in one or more other modules 302-A and 302-B. A shared interface function is a C function with an additional pair of compiler directives (e.g., c2r_shared c2r_interface) associated with the function name.

The shared interface function 322-2 may be created as a regular interface function 502 with an arbitrator 504. The arbitrator 504 may have one set of I/O ports 506 and 508 for each calling process 2 and 3, respectively (e.g., Process 2 in module 302-A and Process 3 in module 302-B).

It is contemplated that any number of calling processes are possible. If multiple processes 2 and 3 call the shared interface function 322 simultaneously, arbitrator 504 may choose the order in which the calls are handled. Exemplary arbitrator 504 connects I/O ports 506 or 508 of the selected caller to interface function 502.

Different types of arbitrators are possible and include, for example, round robin arbitrator types, fixed priority arbitrator types and no arbitration types. A round robin arbitrator type may be the default type of arbitrator to assure fair access for processes 2 and 3. The directive c2r_round_robin associated with the function name is used to set this arbitrator type explicitly.

With the fixed priority arbitrator, a priority number is assigned to each process 2 and 3. In certain exemplary embodiments, a lower number corresponds to a higher priority. If simultaneous calls are performed, the highest priority process is implemented first. To assign a priority, a c2r_priority(N) directive may be associated with the process name, where 'N' is the desired priority. Further, a c2r_fixed_priority directive may be associated with (in front of) the shared interface function name to indicate to C2R compiler 110 to use a fixed priority arbitrator.

If multiple processes are designed such that they never call simultaneously, or there is one process but it calls the interface function both directly and indirectly through another interface function, "no arbitration" may be specified by adding the compiler directive c2r_parallel in front of the function name. In such a case, C2R compiler 110 may wire (ORs) the I/O ports of all the callers together and connect them directly to the interface function 502.

An embedded foreign module may be provided by third-parties and may be used to implement a specific piece of logic. These modules may be on-chip or off-chip, and have a signal interface that is defined to connect with native modules. An on-chip module may be instantiated by C2R's linker, and its interface function may be referred to as an embedded foreign interface function. Typically, such a module is a C function with the directives c2r_foreign and c2r_interface in front of the function name. When the function is invoked, its parameters are specified by a third-party.

The embedded foreign interface function's formal parameters may define the names and bit-widths of signals used in the signal interface. Input signals are c2r_in parameters and output signals are c2r_out parameters. The foreign interface function may not return a value, so void may be specified as the return type.

When an embedded foreign interface function 330 is defined in the native module 302-B, C2R compiler 110 constructs I/O ports on the module's boundary for connection to the foreign module 302-B. The C2R's linker instantiates the foreign module 304 and wires the native module 302-B and foreign module 304 together.

Calling the embedded foreign interface function 330 may sample the foreign interface at an instant in time. The caller's input and output arguments may be copied to/from the signals of the foreign module 304. That is, input arguments may be copied onto input signals, and output signals may be copied onto output arguments. Output arguments are pointers to the caller's variables that receive the output signal values.

A succession of calls to the foreign interface function 330 implement signal timing. For example, if a set of input signals hold their values until an output signal goes active, then a succession of calls in a loop may be made with the input arguments set to the same value until an output argument changes value (e.g., changes from, for example, a 0 logic level to 1 logic level).

Figure 16:
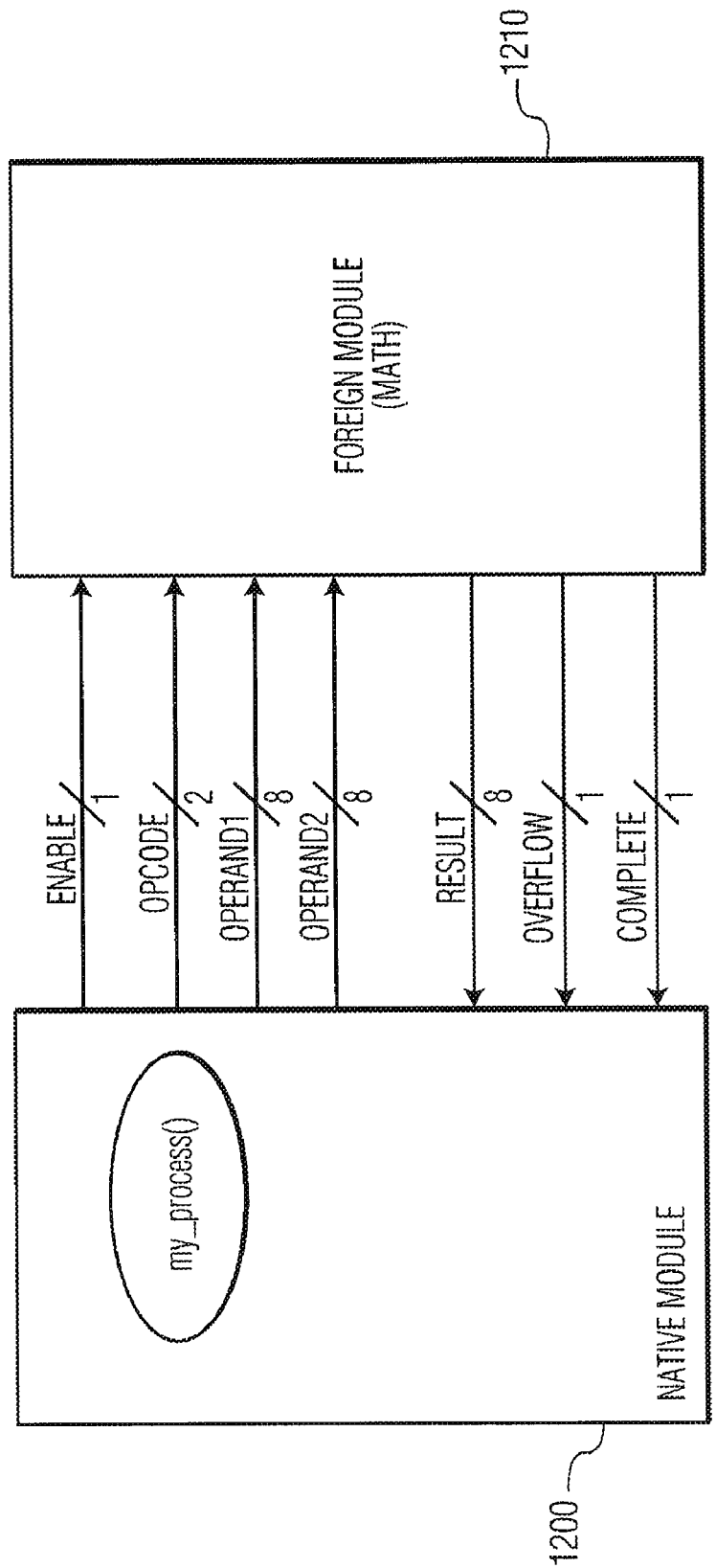
FIG. 16 is a block diagram illustrating an exemplary foreign module in accordance with yet another exemplary embodiment of the invention.

FIG. 16 is a block diagram illustrating an exemplary foreign module in accordance with yet another exemplary embodiment of the invention. As shown, the exemplary foreign module 1210 is called math( ). The prototype is shown in Table 8.

TABLE 8 void c2r_foreign c2r_interface math(uint1_t c2r_in enable,
    uint2_t c2r_in opcode, int8_t c2r_in operand1, int8_t c2r_in
    operand2, int8_t c2r_out *result uint1_t c2r_out *overflow,
    uint1_t c2r_out *complete);

The signal interface of the foreign module 1210 may be defined by a third party. The function prototype may specify parameters that match the signal interface, and the C code may use these arguments in accordance with the specification by the third party. In the above prototype, for example, the complete bit is checked until it indicates that the result variable has been updated.

FIG. 17 is program code illustrating an exemplary embedded foreign interface function in accordance with yet another exemplary embodiment of the invention. The program code may correspond to the foreign module 1210 of FIG. 16.

Referring to FIGS. 16 and 17, a native module 1200 may use a foreign module 1210 to perform arithmetic operations on 8-bit operands and may return an 8-bit result plus overflow. The input signals to the foreign module 1210 may be: (1) an input signal enable, which is 1-bit wide and set to 1 to start the math operation; (2) an input signal opcode, which is 2-bit wide which defines an arithmetic operation to be performed (e.g., addition=0, subtraction=1, multiplication=2 and division=3); and (3) input signals (e.g., operand1 and operand2) which are 8-bits wide signed integers.

The output signals from foreign module 1210 may be: (1) an output signal result, which is a 8-bits wide signed integer; (2) an output signal overflow, which is 1-bit wide and set to 1 if the result is larger than 8 bits wide; and (3) complete, which is 1-bit wide and set to 1 when the operation is complete. For example, as shown in FIG. 17, input signal opcode is set to 2 (i.e., multiply) and input signals operand1 and operand2 are set to 5 and −13, respectively. The output signal result is, thus, set to −65 as a signed 8-bit integer representation.

As shown in FIG. 17, the embedded foreign interface function may be called multiple times to implement signal timing. In general foreign modules have specific handshaking when the embedded foreign interface function is invoked.

In the exemplary foreign function declaration, the function name matches the name of a cell in a cell library that C2R compiler 110 instantiates. The input and output parameter names match the signal names.

After setting the input parameter values as desired, the exemplary process calls math( ) continuously in a loop to hold the input values steady until the foreign module 1210 indicates the operation is complete by asserting complete. The process then calls math( ) one more time to return the input signals to a quiescent state.

Hardware signal names may include characters that are not allowed in the high-level software language (e.g., C or other languages) such as in C parameter names. For instance, Verilog allows the character "!" in a signal name, however, this is not a legal character in a C parameter name. C2R compiler 110 provides the c2r_rename directive to define an embedded foreign interface function for a foreign module that has such a signal name. This directive indicates to C2R compiler 110 an alternate string to substitute for the function's parameter name. The following is an example of the usage of the c2r_rename directive is shown in Table 9.

TABLE 9 void c2r_foreign c2r_interface c2r_rename (seed,
    "seed!value")seed_generator(int seed);

The interface function seed generator( ) defines seed as an input parameter. The actual foreign signal name is seed!value which is not a valid parameter name in C. The c2r_rename directive instructs C2R compiler 110 to substitute the real signal name in place of the parameter name when the signal interface is constructed.

Figure 18:
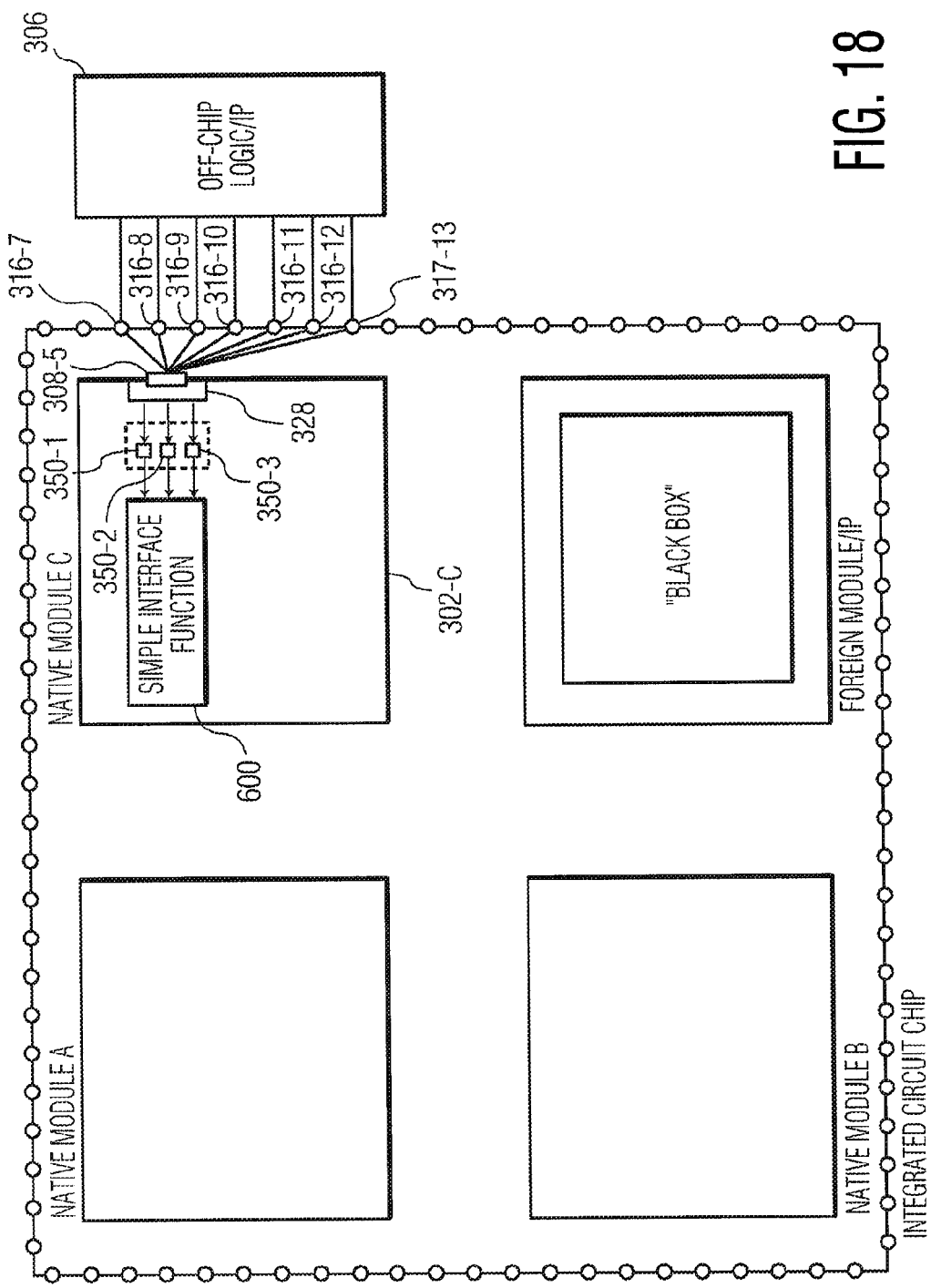
FIG. 18 is a schematic diagram illustrating an exemplary external foreign interface function in accordance with yet another exemplary embodiment of the invention.

FIG. 18 is a schematic diagram illustrating an exemplary external foreign interface function in accordance with yet another exemplary embodiment of the invention. The exemplary external foreign interface function may correspond to the external foreign interface function 328 of FIG. 4.

As shown, an external foreign interface function 328, may be used when native functionality of module 302-C interfaces with off-chip logic 306.

External foreign interface function 328 may continuously copy values between I/O ports 308-5 on a boundary of native module 302-C and static variables 350-1, 350-2 and 350-3 of native module 302-C. If the I/O ports 308-5 correspond one-for-one with I/O pins, for example, input pins 316-7 to 316-9 on the chip 306, an external foreign interface function may copy input pins 316-7, 316-8 and 316-9 to input variables and output variables to output pins, for example, 316-10, 316-11 and 316-12.

To complete the linkage between the native code of simple interface function 600 and I/O pins 316-7 to 316-13 on the chip, the native code reads and writes the static variables 350-1, 350-2 and 350-3. Reading an input static variable returns the latest value copied from an associated input pin, and writing the associated output static variable changes the value on an output pin. In this example, external foreign interface function 328 may not be explicitly called. The definition of the external foreign interface function 328 is used by C2R compiler 110 to generate Verilog code that copies values between I/O pins and the static variables 350-1, 350-2 and 350-3.

Off-chip foreign logic 306 may, for example, calculate an even-parity bit for eight bits of data. An even parity generator for 8 bits of data generates a 9th bit such that the number of '1' bits in all 9 bits is even.

Figure 19:
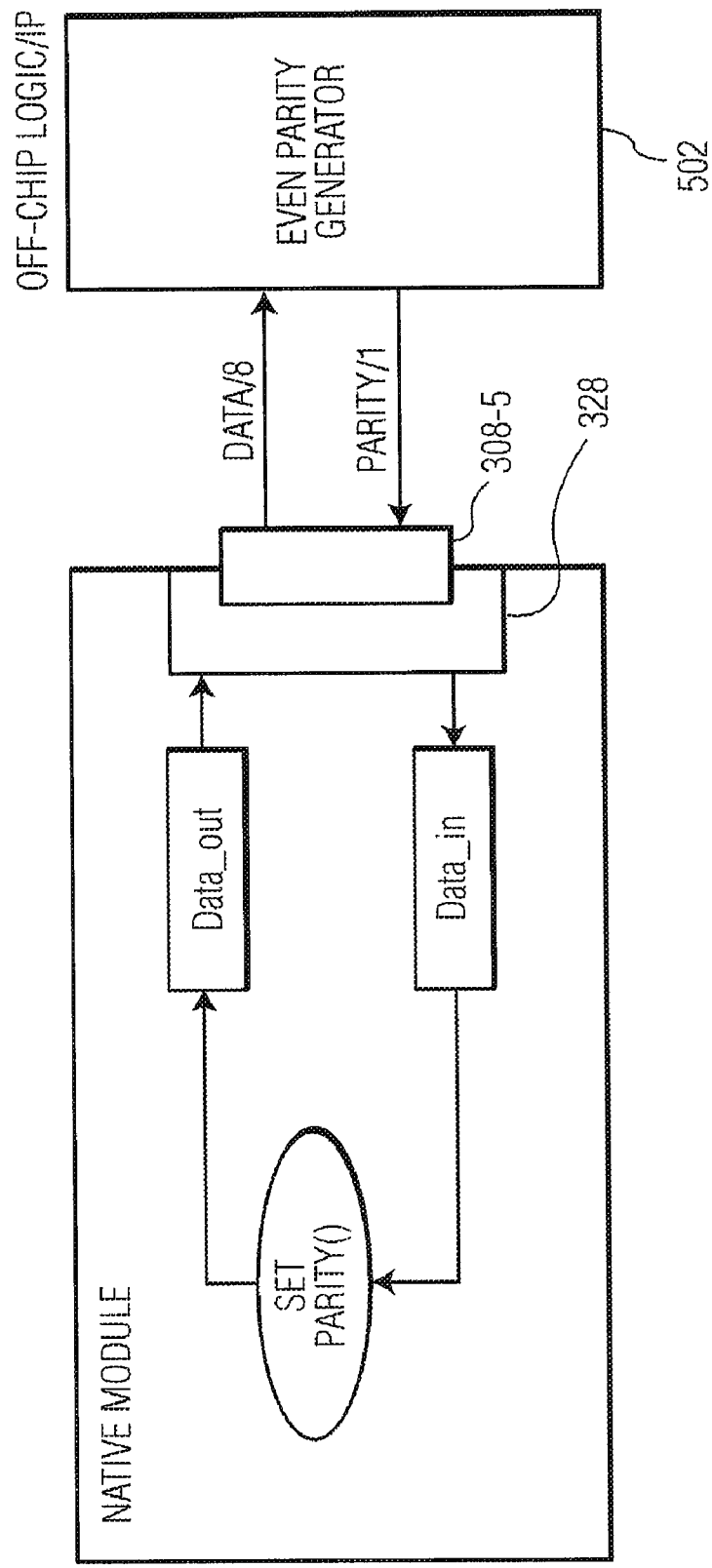
FIG. 19 is a block diagram illustrating an even parity generator provided by off-chip logic 306.

FIG. 19 is a block diagram illustrating an even parity generator 502 provided by off-chip logic 306. As shown, an 8-bit signal (data) is input to even-parity generator 502, and a 1-bit signal (parity) is output from the generator 502. The foreign logic block may be implemented using combinational logic. When the 8-bits of data going to the foreign logic block changes, the parity bit coming out may change accordingly.

FIG. 20 is exemplary program code illustrating a use of the even parity generator of FIG. 19 in accordance with yet another exemplary embodiment of the invention. The even parity generator 502 may correspond to off-chip logic/IP 306 of FIG. 3. As shown, two static variables parity_in and data_out serve as the source and sink of the data and parity signals going to and coming from the foreign logic, respectively. An external foreign interface function parity is defined with parameters that correspond to the signal names and widths. That is, the data parameter is a c2r_out parameter and is 8-bits wide, and the parity parameter is a c2r_in parameter and is 1-bit wide. The body of an external foreign interface function allows assignments using the c2r_in parameter, to assign the value of the parameter to a static variable and the c2r_out parameter to assign the value of a static variable to the parameter. The assignments may occur continuously.

A thread (process) structure may be used to model the parallel nature of hardware modules. The runtime system may guarantee that only one process may be active at any point in time and that each process may run until it suspends itself by calling the clock( ) function. When the system is first loaded all processes may be inactive and a test application program may start one of the processes.

Any variables declared inside a process mainline are visible within that block. File level static variables may be assigned and driven by any code defined in the source file.

If a process mainline has any arguments, they may be declared. These values may be passed from the runtime system at the time the process is first started, and may be used to configure aspects of its operation.

Inter-process queues may allow multiple arguments to be passed and the called process to be awakened when the inter-process queue becomes, for example, non-empty.

Queuing operations are C code functions which become in-line code. C2R compiler 110 may cause a particular queue to be instantiated as a particular module in the generated hardware. One of skill understands that the implementation of a queue (e.g., an inter-process queue) may be dependent on the synthesis tool and the cell libraries used.

The CAC code may interact with modules that are compiled into RTL and are operating within an RTL simulator. That is, co-simulation is possible. A large portion of the design cycle, however, may occur in the software-only environment using CAC testing and debugging. There are at least three modes of interaction between any C component and any simulated RTL component of a system. The three modes of interaction offer differing levels of timing accuracy relative to a completely simulated system and include: (1) a Process based interaction mode (Process Level Simulation (PLS)) in which the RTL simulator is run whenever a process which depends on a value of a signal from a simulated component suspends and other processes are suspended; (2) a Cycle accurate interaction mode in which all processes run for one "clock cycle" then the RTL simulation is run forward in time by one "clock cycle" and the process is repeated and (3) a Signal accurate interaction mode which is similar to the "Cycle accurate" interaction mode except that the RTL simulation may be stopped and the C processes may be awakened whenever there is a change in any signal produced by the RTL simulation on which a C process depends.

A C process may indicate that it has reached the end of a cycle by executing the function c2r_wait( ) which suspends the process. In each type of interaction mode, each process may be executed once per cycle. Although processes may, for example, wait for I/O, the c2r_wait( ) function defines for a particular process, its suspension, thus, allowing another process to awaken within a simulation. By contrast, in a typical conventional HDL all processes are repeatedly executed until the system is stable. At such a point the simulation time is advanced to the next scheduled variable change (e.g., clock edge).

In various exemplary embodiments, the system may forward propagate assigned values until a time changing statement is encountered. Under such conditions, swapping values between two variables uses a temporary variable. The temporary variables do not appear in the generated hardware because of the forward propagation of such values.

Parallelism may be represented in processes, data paths may be coded in the form of pipelines or queues, and variables may be declared such that the variable exists in the generated RTL as flip-flops, or on-chip or off-chip RAM. Third-party RTL integration into the source code may be accomplished by modeling blocks corresponding to, for example, flip-flops or RAM and using foreign interfaces to drive the blocks. The source code may be executed in a native C software environment and exhaustively tested (debugged). Functions may be in-lined in CAC 120. Loops that can be unrolled, may be unrolled and precise clocking may be added by C2R compiler 110 to represent clocking in RTL. Execution and verification of CAC 120 may occur in a pure software environment and may not be burdened by simulation overhead caused by the RTL simulation environment. Bugs in the hardware architecture that may be found through RTL simulation may also be found in the execution and testing of CAC 120.

In CAC 120, data values that are used between processes may be exchanged in the same manner regardless of the implementation of the software module and independent of any order of execution of the processes. CAC 120 optionally adds the ability to defer any modification of an output signal of a software module until the end of the current system clock cycle. In terms of hardware, the software module output signal may be registered and the timing model may be such that the behavior in the software environment is identical to a HDL (RTL) simulator.

A design may be represented as a C language description that may be compiled, executed and debugged using standard C development tools. Further, C2R compiler 110 may be used to substitute RTL for any process which may then be simulated by the HDL simulator. The design may exist with processes implemented, for example, as: (1) C code; (2) RTL description; and/or (3) a mixed level implementation having both C code and RTL description. The mixed level implementation may be simulated with the C code modules interfacing with output from the HDL simulator.

An interface function of a software module, for example, may be simply an external function. When the software module undergoes hardware substitution, a new body may be generated for each of: (1) the module's interface functions; and (2) processes and simulator support code may be generated, which are included in the model if the software module is to be loaded into the simulator. The substitute code bodies and the simulator support code provide a dialog to implement a module interface identical to that provided by the module before substitution.

Many of a module's variables may be retained in the substitute code body. The values of these variables, however, may be provided by the simulation model's support code at the end of each cycle rather than being modified directly. The retained variables may be those variables used by any of the module's interface functions or those used as arguments to external interface functions called by one of the module's processes. The dialog between the C runtime environment and the simulator may be optimized so that the variables about to be referenced are updated from the simulation.

In certain exemplary embodiments, the substitute interface function body may be substantially identical to the version prior to substitution. In such embodiments, for example, assignments to module level variables may be accumulated and driven onto associated signals in the simulation model via a dialog with the simulator support code. Such assignments from each of the substituted modules may be accumulated and composite exchanges of information with the simulator may be conducted.

A dialog with the simulator may include providing a set of values from the software environment, then running the simulator for a predetermined period or until one of the signals changes then returning a new set of values to the software environment.

The substitute for a process body includes code to call interface functions of other modules at appropriate times. Detection of certain conditions may be retained in the simulation model, which may indicate that a call is to be made to the simulator support code. In the case, for example, of an RTL or lower level simulation model, the compiler generated module support code may include logic specifically to detect, for example, certain predetermined conditions.

As one example, the process dest may include an interface output which uses the header file shown in Table 10 to implement a queue.

TABLE 10

```
source.c
#include "dest.h"
process source( ) {
int i = 0;
clock( );
while (1) {
    output(i++);
    clock( );
    }
}
dest.c
#include "queuing.h"
QUEUE(10, int) q;
process dest( ) {
int i;
clock( );
while (1) {
    while (Q_EMPTY(q)) {
    clock( );
    }
DEQUEUE(q, i);
printf("%d\n", 1);
}
}
interface output(int i) {
while (Q_FULL(q)) {
    clock( );
}
ENQUEUE(q, i);
}
In the previous code clock( ) expands to . . .
clock( ) {
s = splhigh( );
wakeup(sim_client);
tsleep( );
splx(s);
}
```

This has the effect of transferring execution to the sim_client thread while putting the process to sleep by waking the sim_client thread followed by putting the current thread to sleep with the splhigh/spix pair ensuring that the sim_client thread is not a woken until after the current thread sleeps. sim_client is the kernel thread that manages the dialog between processes and the simulator. For the case where no processes are replaced by RTL, each process starts and runs sequentially swapping processes on each clock( ).

PLS may be the least computationally expensive mode of simulation. PLS guarantees that the simulator runs whenever the process that depends on the value of the signal from the simulated component suspends and other processes are also suspended. C2R compiler 110 may be used to generate RTL and the simulator support code for each process. For each process that is selected for hardware substitution, and is compiled to RTL, the following code fragments may be generated: (1) the RTL implementation of the process, which is a code fragment that is a result of converting the software code (e.g., C code) into RTL; (2) RTL and Programming Language Interface (PLI) stubs for each called interface, the RTL stubs may exist for each non-RTL implemented interface that interacts with the process; and (3) an operating system support thread which replaces the original process in the kernel and is responsible for the communications between the RTL implementation of the process and the software implemented process.

Each software process that is mapped to hardware may use one or more queues for its interfaces and arguments to interface with the RTL implementation of the called process. The support thread iterates over the queue built by sim_client for the called process and executes the called software process followed by signaling back to the Verilog version of the process (e.g., the RTL implementation of the process) that the software process has been called. This signal may be sent after all the interfaces are called.

A software program (e.g., a C program) may be considered to be a logic description at a higher level of abstraction than RTL code. Thus, C may be a good language for describing complex logic that may be converted into hardware. C programs written with custom hardware may not be the only programs that may be converted. Because C2R compiler 110 may recognize full ANSI C, (1) C programs originally written for processor-based environments may also be processed by C2R compiler 110 for translation to RTL (e.g., Verilog RTL); or (2) programs in other languages may be converted to C code then translated to Verilog RTL.

C2R compiler 110 may examine the C code for special compiler directives that are used to: (1) identify portions of code called processes that run continuously; (2) specify how components are connected to each other, (3) describe the types of storage being used, and (4) depict the chip's interface with the outside world.

C2R compiler 110 allows C source code to be compiled directly to RTL for eventual synthesis to gates. The input to C2R compiler 110 is C code, and its output is RTL for processing by industry standard synthesis and simulation flows. C2R compiler 110 may also produce a CAC representation of the corresponding hardware, which may be run and verified in real time, without the use of the RTL simulation.

To achieve the greatest speed, a hardware device may implement parallelism. The c2r_process directive creates an autonomous finite state machine that runs in parallel with other processes. C2R compiler 110 may include other directives for achieving efficient parallelism. These directives may allow individual statements of program code or sections of program code to run in parallel.

When C statements are converted to Verilog, many statements may be capable of executing in the same clock cycle. The more of these statements that run in one clock cycle, the faster the chip. Clock cycles may be inserted to align the various statement in time. C2R compiler 110 may determine whether to run statements in the same clock cycle and when to insert a clock cycle between statements. C2R compiler 110 may provide the appropriate clocking of such statements in a clock-insertion phase.

A c2r_fork directive may be used to create two or more threads in the multi-thread environment that run in parallel until they all complete and then synchronize by joining back into a single thread. A c2r_spawn directive may be used to create a thread that runs in parallel with a main thread. The c2r_spawn directive differs from c2r_fork because the spawned thread does not synchronize with the main thread but instead, terminates.

C2R compiler 110 may use a forwarding technique to increase the number of statements that may execute in the same clock cycle to improve the speed (i.e., by decreasing the number of clock insertions) of the resulting software code.

By running software code in hardware (e.g., as RTL in the RTL simulator), several statements may be executed in the same clock cycle. Running such statements simultaneously, however, may introduce errors when one statement affects subsequent statements.

TABLE 11 a = x;
b = y;
c = a + b;

For example, if the three statements shown in Table 11 are executed in the same clock cycle, then c equals the sum of a plus b prior to the x and y assignments. That is, if a=5, b=6, x=10, y=20, then c equals 11. If proper clocking is included, however, such assignments of a and b occur and c equals 30 (i.e., 10 plus 20).

To avoid such errors due to clocking, C2R compiler 110 may insert a clock before the assignment statement for c. Thus, the first and second statements are completed prior to the assignment statement for c being executed. In certain exemplary embodiments, C2R compiler 110 may use other methods to avoid the clocking errors, for example, by a forwarding technique. That is, C2R compiler 110 may determine the value or expression of each variable after each assignment statement and use the determined values or expressions in subsequent statements. C2R compiler 110 may, in the above example, determine that a is the value of x and b is the value of y. C2R compiler 110 may change the assignment to c=x+y to eliminate the clock insertion.

C2R compiler 110 may include a first mode (sparse clocking together with forwarding) or a second mode (conservative clocking). It is also possible to implement either the first or second modes, as the default mode, which may be overridden for a specified section of program code based on a directive to C2R compiler 110. In certain exemplary embodiments forward clocking is the default mode.

In the first mode (sparse clocking together with forwarding), C2R compiler 110 may not insert a clock before a statement that is affected by the results of a previous statement if the result may be forwarded to the subsequent statement.

In the second mode (conservative clocking), C2R compiler 110 ensures that dependent statements may be executed in different clock cycles by inserting a clock before statements that are affected by the results of a previous statement.

Although forward clocking may be the default mode, conservative clocking may be applied to all variables within a specified process, interface function or accessor function by using, for example, the c2r_clocking (C2R_CONSERVATIVE) directive. The following example uses the conservative clocking directive in a process main( ).

TABLE 12

C2r_process c2r_clocking(C2R_CONSERVATIVE) main ( )
{
a = 4;
b = a*2;
c = a/2 + 5;
d = a + b + c;
}

Assume, before this code segment is reached, a=0. If the statements in Table 12 are executed in a software program, the values of each variable at the completion of the last statement would be: a=4; b=8; c=7; d=19. If, however, all these statements are executed simultaneously, then at their completion, a=4; b=0; c=5, d=9.

C2R compiler 110 may include conservative clock insertion as provided below to allow for the proper assignment of the variable. The "<clock>" notation in Table 13 indicates the location where C2R compiler 110 inserts a clock.

TABLE 13 a = 4;
<clock>;
b = a*2;

TABLE 13-continued

```
c = a/2 + 5;
<clock>;
d = a + b +c;
```

C2R compiler 110 inserts a clock before the assignment to b because the new value of a is used and also inserts a clock before the assignment to d because the new values of b and c are used. When C2R compiler 110 uses conservative clocking, execution time may increase compared with sparse clocking with forwarding. Sparse clocking with forwarding may be used to decrease the number of clock insertions. For example, the statements using sparse clocking with forwarding may as shown in Table 14.

TABLE 14

```
a = 4;
b = 4*2;
c = 4/2 + 5;
d = 4 + 4*2 + 4/2 + 5;
```

For the above exemplary code, sparse clocking with forwarding uses no clock insertions while conservative clocking uses 2 clock insertions.

One of skill understands that although the above example illustrates the use of constants with forwarding, variable (e.g., algebraic expression) may also be forwarded to avoid clock insertions. For example, if x is a variable and the value of x is known only at run time, the variable x may be forwarded, not its value.

If a variable is assigned an expression that does not include the variable followed by assignment of an expression that does includes the variable, C2R compiler 110 may stop applying forwarding and may insert a clock. C2R compiler 110 may insert clocks before statements when the statement includes a variable that is indirectly assigned an expression that includes the variable.

Forwarding may be applied independently to each process, interface function and/or custom accessor function. For global variables, which may be passed between processes and among processes, interface functions and custom accessor functions (e.g., that may be asynchronous), conservative clocking may be used.

Figure 21:
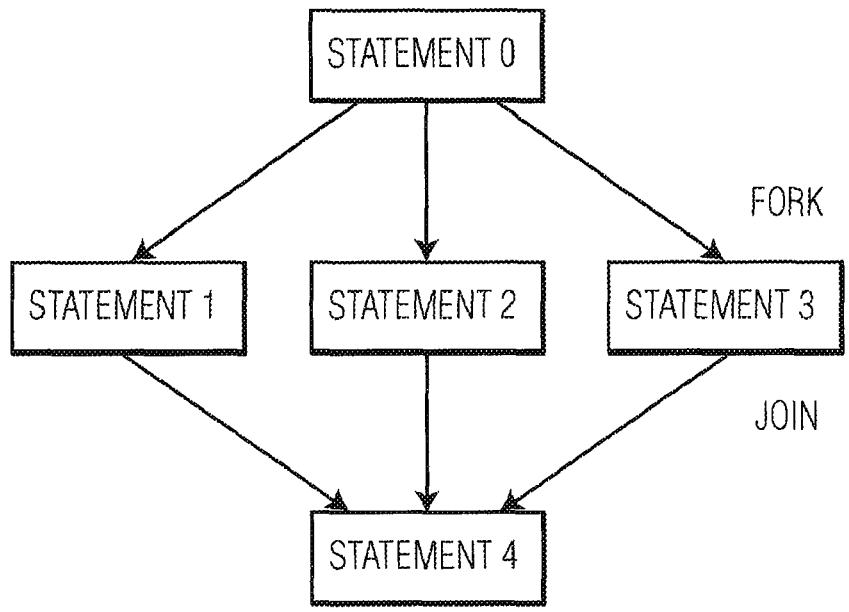
FIG. 21 is a block diagram illustrating a forking method in accordance with yet another exemplary embodiment of the invention.

FIG. 21 is a block diagram illustrating a forking method in accordance with yet another exemplary embodiment of the invention.

Referring to FIG. 21, a c2r_fork directive is used to specify that statements may be run in parallel. An example of a c2r_fork directive is shown in Table 15.

TABLE 15

```
statement 0;
c2r_fork
{
statement 1;
statement 2;
statement 3;
}
statement 4;
```

C2R compiler 110 interprets the c2r_fork directive to run statements 1, 2 and 3 simultaneously. Each statement may be a single statement or a group of statements with different completion times. The c2r_fork directive may assure that statements 1, 2 and 3 join at the completion of the last statement 1, 2 or 3 to complete. After completion, execution may continue with statement 4.

C2R compiler 110 may use forwarding with the c2r_fork directive. For example, C2R compiler 110 may use forwarding from statement 0 to any of the forked statements and from any of the forked statements to statement 4. Conservative clocking may be used across forked statements.

If forward clocking is used, forwarding of results is implemented from the main thread (e.g., statement 0) into each of the forked threads (e.g., statements 1, 2 and 3), and from each of the forked threads to the resynchronized thread (e.g., statement 4).

Figure 22:
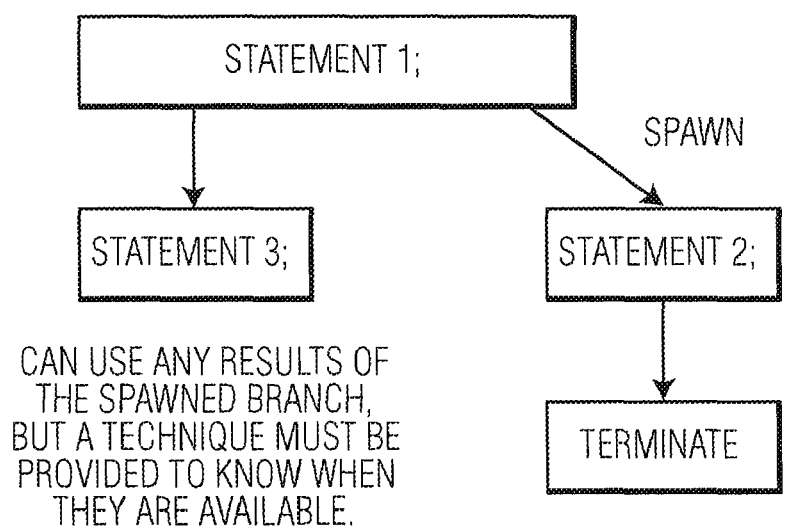
FIG. 22 is a block diagram illustrating a spawning method in accordance with yet another exemplary embodiment of the invention.

FIG. 22 is a block diagram illustrating a spawning method in accordance with yet another exemplary embodiment of the invention.

In certain exemplary embodiments, a particular block of program code may run independently (e.g., asynchronously) from the rest of a process (other portions of the program code) or the portions may be synchronized from within the program code itself. In such embodiments, C2R compiler 110 may use a c2r_spawn directive to initiate execution of an independent parallel block of program code such that the particular block of program code may run in parallel with the rest of the process and then may terminate when it completes. One branch may be spawned using the c2r_spawn directive and forwarding may be used in the main thread and the spawned thread. Because the main thread and the spawned thread may be independent (asynchronous), forwarding does not occur between them. Because the spawned thread terminates, there is no forwarding from it.

Referring to FIG. 22, the c2r_spawn directive is used to specify that statements which may typically be run sequentially be run in parallel.

An example of a c2r_spawn directive is shown in Table 16.

TABLE 16

```
statement 1;
c2r_spawn
{
statement 2;
}
statement 3;
```

The spawned thread (statement 2) may generate an independent result/process or the result may be used by the main thread (e.g., statement 3). Since C2R compiler 110 does not provide synchronization when the c2r_spawn directive is specified, if the spawned thread (statement 2) generates a result that is used by the main thread (statement 3), synchronization is provided external to C2R compiler 110 to ensure the result from the spawned thread is available to the main thread.

When forward clocking is used, C2R compiler 110 may forward results from the main thread to the spawned thread but, because the spawned thread terminates, results may not be forwarded from it. After the spawned thread (statement 2) is spawned, there is no forwarding between it (statement 2) and the main thread (statement 3).

Figure 23:
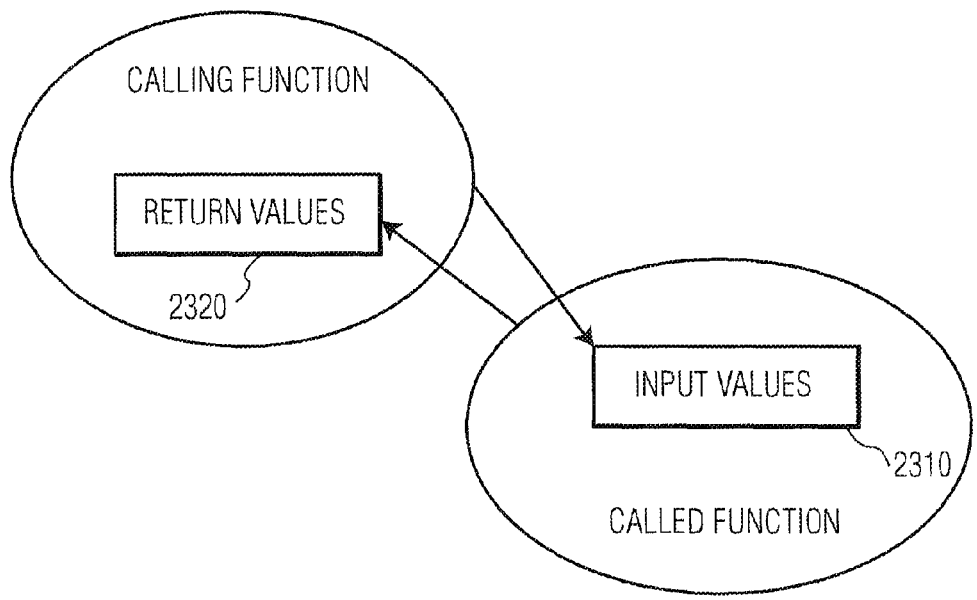
FIG. 23 is a block diagram illustrating the use of a c2r_arg_storage(mode) directive in accordance with yet another exemplary embodiment of the invention.

FIG. 23 is a block diagram illustrate the use of a c2r_arg_storage(mode) directive in accordance with yet another exemplary embodiment of the invention.

When calling an interface function, two sets of registers may exist (one associated with the called function to hold the input variables and one associated with the calling function to hold the return values).

Referring to FIG. 23, c2r_arg_storage(mode) directive may be used to eliminate either or both of calling and called registers 2310 and 2330. If the called function does not use stored input values beyond the cycle of the call, calling register 2310 holding the input values may be eliminated by setting mode to NO_LOCAL_ARG_STORE. If the values of the return arguments do not change beyond the first cycle after the call completes, called register 2320 holding the return values may be eliminated by setting mode to NO_ARG_HOLD.

Figure 24:
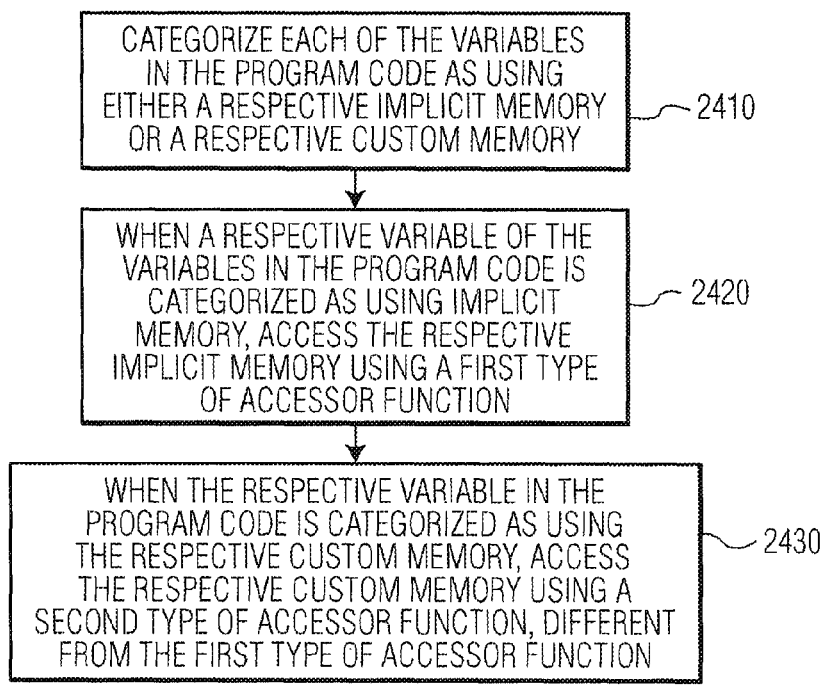
FIG. 24 is a flow chart illustrating a method for converting program code to hardware in accordance with yet another exemplary embodiment of the invention.

FIG. 24 is a flow chart illustrating a method for converting program code to hardware (by compiling program code into an HDL synthesizable design) in accordance with yet another exemplary embodiment of the invention.

As shown, at step 2410, each of the variables in the program code (e.g., C code) may be categorized as using either a respective implicit memory or a respective custom memory. At step 2420, when a variable of the program code is categorized as using implicit memory, the respective implicit memory may be accessed using a first type of accessor function. At step 2430, when the variable in the program code is categorized as using a respective custom memory, the respective custom memory may be accessed using a second type of accessor function. The second type of accessor function (e.g., a custom accessor function that may include a timing model) may be different from the first type of accessor function (e.g., a foreign accessor function). That is, different types of accessor functions may be associated with different types of memory.

Figure 25:
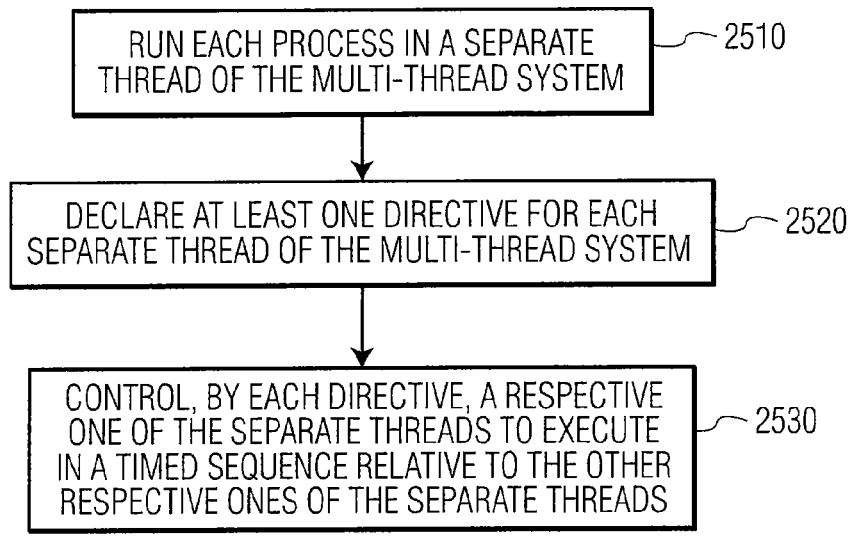
FIG. 25 is a flow chart illustrating a method of simulating hardware in program code using a multi-thread system in accordance with yet another exemplary embodiment of the invention.

FIG. 25 is a flow chart illustrating a method of simulating hardware in program code (e.g., C code) using a multi-thread system in accordance with yet another exemplary embodiment of the invention.

As shown, at step 2510, each process may be executed in a separate thread of a multi-thread system. That is, each process may be mapped to a different thread of a plurality of such threads in the system. At step 2520, at least one directive for each separate thread of the multi-thread system may be declared in the program code. At step 2530, a respective one of the separate threads may be controlled to execute in a timed sequence relative to the other separate threads. That is, for example, only one thread at a time may be executed in the multi-thread system. As such, deterministic results may be insured for each process running in the multi-thread system.

Figure 26:
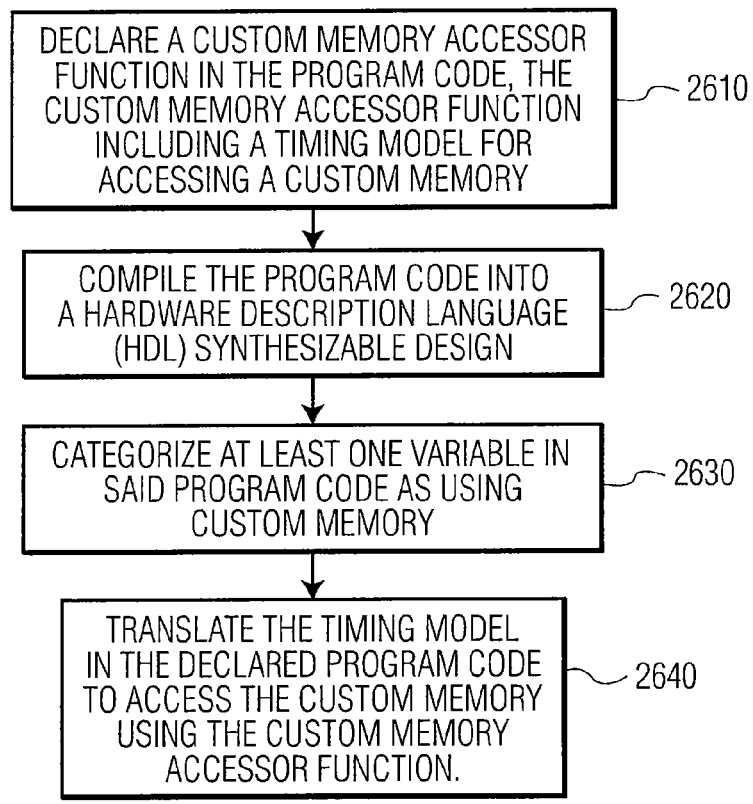
FIG. 26 is a flow chart illustrating a method of simulating hardware in program code in accordance with yet another exemplary embodiment of the invention.

FIG. 26 is a flow chart illustrating a method of simulating hardware in program code (e.g., C code) in accordance with yet another exemplary embodiment of the invention.

As shown, at step 2610, a custom memory accessor function is declared in the program code. The custom memory accessor function includes a timing model for accessing a custom memory. Next, the program code is compiled into a HDL synthesizable design. That is, at step 2620, at least one variable in the program code may be categorized as using custom memory and at step 2630, the timing model in the declared program code may be translated to access the custom memory using the custom memory accessor function.

Figure 27:
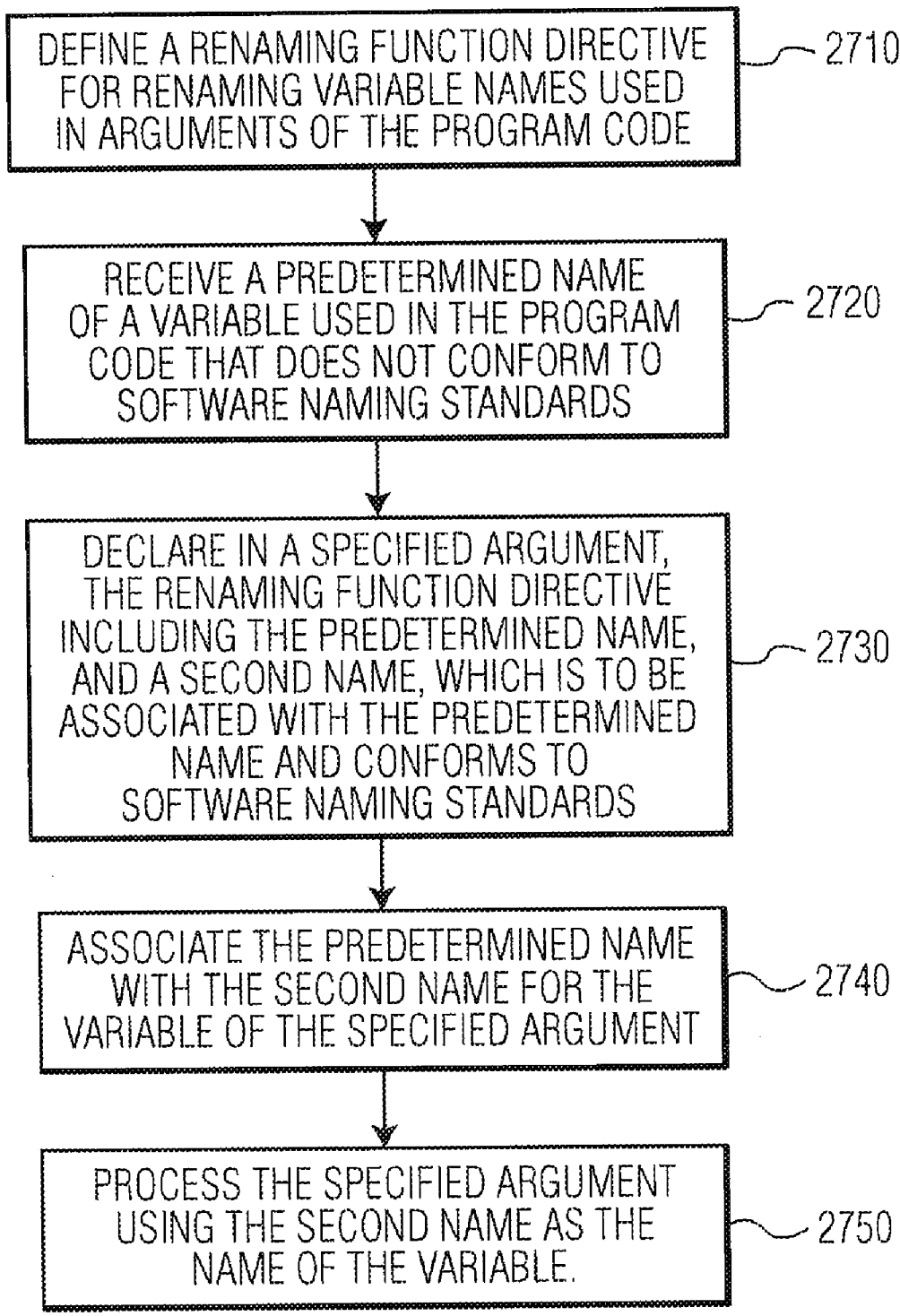
FIG. 27 is a flow chart illustrating a method of generating RTL code from program code in another program language to simulate hardware in accordance with yet another exemplary embodiment of the invention.

FIG. 27 is a flow chart illustrating a method of generating RTL code from program code in another program language to simulate hardware in accordance with yet another exemplary embodiment of the invention.

As shown, at step 2710, a renaming function directive may be defined for renaming variable names used in arguments of the program code. At step 2720, a predetermined name of a variable used in the program code that does not conform to software naming standards may be received. At step 2730, the renaming function directive including the predetermined name, and a second name, which is be to be associated with the predetermined name and conforms to software naming standards may be declared. At step 2740, the predetermined name may be associated with the second name for the variable of the specified argument. At step 2750, the specified argument may be processed using the second name as the name of the variable.

In certain exemplary embodiments, the accessor functions allow implicit storage to be used, regardless of the physical representation of that storage. An accessor function maps purely software constructs that imply access to memory through a microprocessor, to an actual access to memory without a microprocessor.

In various exemplary embodiments, untimed ANSI C may be the design language, verification may take place in a pure C software environment, architecture may be explored and implemented in the C source, and synthesizable Verilog RTL may automatically generated. The result may be a flow that dramatically shortens the development time for complex chips and or chip sets, e.g., Software on a Chip (SoC), ASIC and/or FPGA based designs. By enabling software algorithms to be implemented in dedicated hardware, lower cost, and lower power chips may be produced.

According to certain embodiments of the present invention, a C2R compiler is provided to allow testing and debugging of CAC code in a real-time environment, while also providing verifiable functionally equivalent RTL code such that RTL simulation which is a much slower process may be reduced or substantially eliminated.

Although the invention has been described in terms of a program code, it is contemplated that it may be implemented in software on microprocessors/general purpose computers (not shown). In various embodiments, one or more of the functions of the various components may be implemented in software that controls a general purpose computer. This software may be embodied in a computer readable storage medium, for example, a magnetic or optical storage disk, or a memory-card.

In addition, although the invention is illustrated and described herein with reference to specific embodiments, the invention is not intended to be limited to the details shown. Rather, various modifications may be made within the scope and range of equivalents of the claims and without departing from the invention.

What is claimed:

1. A method for converting program code that is not in a hardware description language (HDL) to hardware, said program code including an algorithmic representation of a process using variables, the method comprising the steps of:
  compiling, by a computer, the program code into an HDL synthesizable design, said step of compiling includes the steps of:
    categorizing each of said variables in said program code as using either a respective implicit memory or a respective custom memory,
    when a respective variable of the variables in said program code is categorized as using the respective implicit memory, defining a first type of accessor function for accessing the respective implicit memory, the first type of accessor function defining a signal interface using a set of predetermined parameters to access the respective implicit memory, and
    when the respective variable in said program code is categorized as using the respective custom memory:
    (1) defining a second type of accessor function for accessing the respective custom memory, the second type of access function being different from the first type of accessor function, and (2) defining a foreign interface function that includes assignments between the respective custom memory and the respective variable, the second type of accessor function defining a memory access protocol and a timing model for accessing the respective custom memory, the timing model including at least one of a sequence of read transaction rules or a sequence of write transaction rules for reading or writing to the custom memory, each respective transaction rule being associated with a timing parameter of the timing model; and generating the hardware including implementing, as hardware, the first and second accessor functions based on said HDL synthesizable design.

2. The method as in claim 1, wherein said respective implicit memory is a register file memory.

3. The method as in claim 1, wherein the program code further includes a further algorithmic representation of a further process;

the step of compiling the program code into the HDL synthesizable design includes the steps of:
defining a first HDL synthesizable module representing the process and a second HDL synthesizable module representing the further process,
dynamically allocating a pointer to a global variable of the variables, and
providing an interface function, which uses the dynamically allocated pointer, to define inputs and/or outputs for the global variable used by at least one of the first or second HDL synthesizable modules.

4. The method as in claim 1, further comprising the step of:
restructuring portions of first program code into the program code representing the process, the program code representing the process being coded to be non-terminating; and
mapping the input and output of the non-terminating program code representing the process to one of a global variable or a process queue such that variables are passed to the non-terminating program code through the global variable or the process queue.

5. The method as in claim 1, wherein said signal interface includes names and widths of signals, and identifies a predetermined timing model for the memory.

6. The method as in claim 5, wherein the predetermined timing model is a synchronization model.

7. The method as in claim 5, further comprising the step of:
defining, a lane access parameter, for accessing a subset of bits of the respective implicit memory, responsive to accessing the respective implicit memory; and
reading to or writing from the subset of bits of the respective implicit memory using the lane access parameter.

8. The method as in claim 1 wherein the program code is written in ANSI C program language and the HDL is Verilog Register Transfer Level (RTL).

9. The method as in claim 1, further including the step of defining attributes of a compiler directive, wherein the step of categorizing each of said variable includes using said defined attributes of the compiler directive to establish the accessor function corresponding to the respective custom memory.

10. The method as in claim 1, wherein the custom memory includes off-chip custom memory external to the HDL synthesizable design and on-chip custom memory internal to the HDL synthesizable design.

11. The method as in claim 1 wherein, when said variable is categorized as using custom memory, and when said custom memory is off-chip custom memory that is external to the HDL synthesizable design, the method further comprises:
defining the foreign interface function as a series of assignment statements from memory output pins of the off-chip custom memory to corresponding static variables and from the static variables to corresponding input pins of the off-chip memory.

12. The method as in claim 1, wherein said HDL is Verilog Register Transfer Level (RTL) and wherein said hardware device is an Application-Specific Integrated Circuit (ASIC) or a Field Programmable Gate Array (FPGA).

13. A system for converting program code that is not in a hardware description language (HDL) to hardware, said program code including an algorithmic representation of a process, the system comprising:
means, including a computer, for compiling the program code into an HDL synthesizable design, wherein said means for compiling includes:
means for categorizing each of said variables in said program code as using either a respective implicit memory or a respective custom memory,
means for accessing the respective implicit memory using a first type of accessor function when a respective variable in said program code is categorized as using the respective implicit memory, the first type of accessor function defining a signal interface using a set of predetermined parameters to access the respective implicit memory, and
means for accessing the respective custom memory using: (1) a second type of accessor function, different from the first type of accessor function, and (2) a foreign interface function, when the respective variable in said program code is categorized as using the respective custom memory, the second type of accessor function defining a memory access protocol and a timing model for accessing the respective custom memory and the foreign interface function including assignments between the respective custom memory and the respective variable, the timing model including at least one of a sequence of read transaction rules or a sequence of write transaction rules for reading or writing to the custom memory, each respective transaction rule being associated with a timing parameter of the timing model; and
means for generating the hardware, including at least one of the first or second type of accessor function, from the HDL synthesizable design.

14. A method for converting program code that is not in a hardware description language (HDL) to hardware, said program code including an algorithmic representation of a plurality of process, the method comprising the steps of:
compiling, by a computer, the program code into an HDL synthesizable design, said step of compiling includes the steps of:
defining a first HDL synthesizable module corresponding to a first one of the plurality of processes and a second HDL synthesizable module corresponding to a second one of the plurality of processes,
defining input/output ports for the first and second HDL synthesizable modules, and
defining an interface function shared between the first and second HDL synthesizable modules to:
define inputs and/or outputs between the first and second ones of the plurality of processes that map to the defined input and output ports of the first and second HDL synthesizable modules;
categorize each variable in said program code which is shared by the first and second HDL synthesizable modules as using either implicit memory or custom memory, when a respective variable which is shared by the first and second HDL synthesizable modules is categorized as using implicit memory, define a first type of accessor function inside of the shared interface function for accessing a respective implicit memory from the first and second HDL synthesizable modules, the first type of accessor function defining a signal interface using a set of predetermined parameters to access the implicit memory, and when the respective variable which is shared by the first and second HDL synthesizable modules is categorized as using the custom memory: (1) define a second type of accessor function inside the shared interface function for accessing a respective custom memory from the first and second HDL synthesizable modules, and (2) define a foreign interface function that includes assignments between the respective custom memory and the respective variable, the second type of accessor function being different from the first type of accessor function, the second type of accessor function defining a memory access protocol and a timing model for accessing the respective custom memory, the timing model including at least one of a sequence of read transaction rules or a sequence of write transaction rules for reading or writing to the custom memory, each respective transaction rule being associated with a timing parameter of the timing model; and generating the hardware including implementing, as hardware, the first and second HDL synthesizable modules and the shared interface function including the first and second accessor functions based on said HDL synthesizable design.

15. The method as in claim 14, wherein the interface function is shared between the first and second HDL synthesizable modules and defines an arbitrator to arbitrate priority of access through the shared interface function, the arbitrator including at least one of: (1) a round robin arbitrator in which concurrent calls from the first HDL synthesizable module and second HDL synthesizable modules are cycled; or (2) a priority arbitrator in which a priority value is assigned to each respective HDL synthesizable module and concurrent calls from the first HDL synthesizable modules and the second HDL synthesizable module are arbitrated by the priority arbitrator based on the assigned priority values.

* * * * *